(12) United States Patent
Kubo

(10) Patent No.: US 12,526,884 B2
(45) Date of Patent: Jan. 13, 2026

(54) METHOD FOR MANUFACTURING LIGHT-EMITTING DEVICE

(71) Applicant: SHARP KABUSHIKI KAISHA, Sakai (JP)

(72) Inventor: Masumi Kubo, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 732 days.

(21) Appl. No.: 17/795,083

(22) PCT Filed: Feb. 6, 2020

(86) PCT No.: PCT/JP2020/004599
§ 371 (c)(1),
(2) Date: Jul. 25, 2022

(87) PCT Pub. No.: WO2021/157020
PCT Pub. Date: Aug. 12, 2021

(65) Prior Publication Data
US 2023/0089691 A1 Mar. 23, 2023

(51) Int. Cl.
*H05B 33/14* (2006.01)
*H10H 20/811* (2025.01)
*H10H 20/822* (2025.01)

(52) U.S. Cl.
CPC ........... *H05B 33/14* (2013.01); *H10H 20/811* (2025.01); *H10H 20/822* (2025.01)

(58) Field of Classification Search
None
See application file for complete search history.

(56) References Cited

U.S. PATENT DOCUMENTS

| 10,446,782 | B1 * | 10/2019 | Han | H10K 85/1135 |
| 2008/0173886 | A1 * | 7/2008 | Cheon | C09K 11/7774 |
| | | | | 257/E33.068 |
| 2010/0117110 | A1 * | 5/2010 | Park | H10H 20/80 |
| | | | | 257/E33.068 |

FOREIGN PATENT DOCUMENTS

JP 2017-025220 A 2/2017

OTHER PUBLICATIONS

Masami Tanemura, "Random Packing (Physics on Form, Workshop Report)",Bussei Kenkyu (1984), 42 (1): 76-77, Apr. 20, 1984.

* cited by examiner

*Primary Examiner* — Dale E Page
*Assistant Examiner* — Patrick Cullen
(74) *Attorney, Agent, or Firm* — ScienBiziP, P.C.

(57) ABSTRACT

A method for manufacturing a light-emitting device includes forming the quantum dot layer, wherein the forming the quantum dot layer includes performing first application of applying, on a position overlapping with the substrate, a first solution including quantum dots, a ligand, a first inorganic precursor, and a first solvent, the quantum dots each including a core and a first shell coating the core, the ligand coordinating with each of the quantum dots, performing temperature raising of raising a temperature until the ligand melts and the first solvent vaporizes after the performing first application, performing first temperature lowering of lowering a temperature to a melting point of the ligand or lower after the performing temperature raising, and performing first light irradiation of epitaxially growing the first inorganic precursor around the first shell by first light irradiation after the performing first temperature lowering to form a second shell coating the first shell.

18 Claims, 19 Drawing Sheets

A

B

A

B

METHOD FOR MANUFACTURING LIGHT-EMITTING DEVICE

TECHNICAL FIELD

The disclosure relates to a method for manufacturing a light-emitting device.

BACKGROUND ART

PTL 1 discloses a semiconductor nanoparticle (quantum dot) having a core/shell structure and a ligand that coordinates with the semiconductor nanoparticle.

CITATION LIST

Patent Literature

PTL 1: JP 2017-025220 A

Non Patent Literature

NPL 1: Tanemura Masami, "Random Packing (Physics on Form, Workshop Report)", Bussei Kenkyu (1984), 42 (1), 76-77

SUMMARY OF INVENTION

Technical Problem

An improvement in luminous efficiency is desired in a light-emitting device including a quantum dot layer.

Solution to Problem

In order to solve the problem described above, a method for manufacturing a light-emitting device according to the disclosure is a method for manufacturing a light-emitting device including, on a substrate, a light-emitting element including a first electrode, a second electrode, and a quantum dot layer between the first electrode and the second electrode, and the method includes forming the quantum dot layer, wherein the forming the quantum dot layer includes performing first application of applying, on a position overlapping with the substrate, a first solution including a plurality of quantum dots, a ligand, a first inorganic precursor, and a first solvent, the plurality of quantum dots each including a core and a first shell coating the core, the ligand coordinating with each of the plurality of quantum dots, performing temperature raising of raising a temperature until the ligand melts and the first solvent vaporizes after the performing first application, performing first temperature lowering of lowering a temperature to a melting point of the ligand or lower after the performing temperature raising, and performing first light irradiation of epitaxially growing the first inorganic precursor around the first shell by first light irradiation after the performing first temperature lowering to form a second shell coating the first shell, and the ligand is present around the second shell after the first light irradiation.

Advantageous Effects of Disclosure

According to the configurations described above, luminous efficiency may be further improved in a light-emitting device provided with quantum dots.

DESCRIPTION OF EMBODIMENTS

First Embodiment

Figure 1:
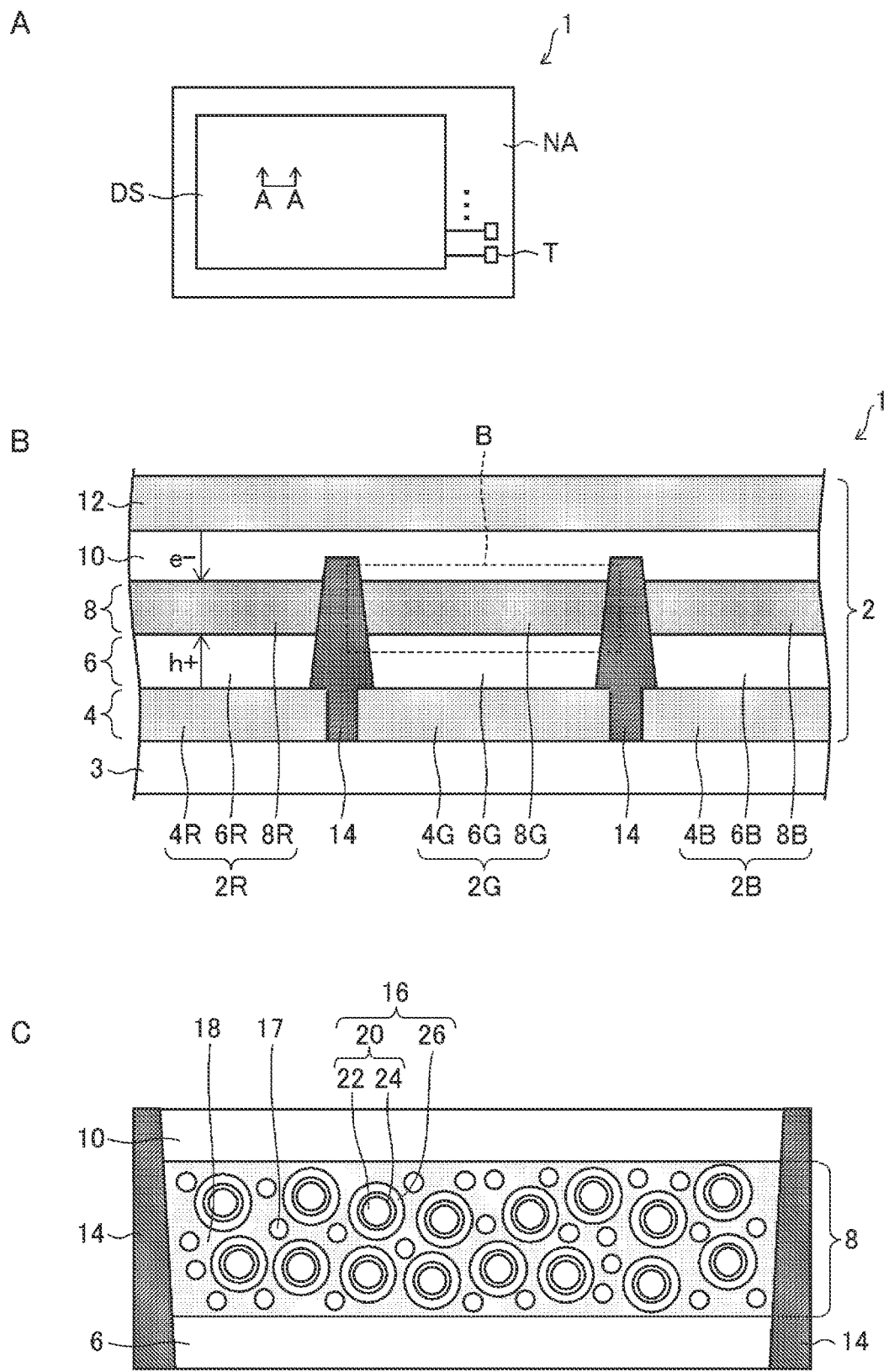
FIG. 1A is a schematic top view of a light-emitting device according to a first embodiment.
FIG. 1B is a schematic cross-sectional view of the light-emitting device according to the first embodiment.
FIG. 1C is a schematic enlarged view of a periphery of a light-emitting layer of the light-emitting device according to the first embodiment.

FIG. 1A is a schematic top view of a light-emitting device 1 according to the present embodiment. FIG. 1B is a cross-sectional view taken along a line A-A in FIG. 1A. FIG. 1C is an enlarged cross-sectional view of a region B in FIG. 1B, that is, an enlarged cross-sectional view of a perimeter of a second light-emitting layer 8G to be described later.

As illustrated in FIG. 1A, the light-emitting device 1 according to the present embodiment includes a light-emitting face DS from which light emission is extracted and a frame region NA surrounding a periphery of the light-emitting face DS. In the frame region NA, a terminal T may be formed into which a signal for driving a light-emitting element of the light-emitting device 1 described in detail later is input.

At a position overlapping with the light-emitting face DS in plan view, as illustrated in FIG. 1B, the light-emitting device 1 according to the present embodiment includes a light-emitting element layer 2 and an array substrate 3. The light-emitting device 1 has a structure in which respective layers of the light-emitting element layer 2 are layered on the array substrate 3, in which a thin film transistor (TFT; not illustrated) is formed. In the present specification, a direction from the light-emitting element layer 2 to the array substrate 3 of the light-emitting device 1 is referred to as "downward direction", and a direction from the light-emitting element layer 2 to the light-emitting face DS of the light-emitting device 1 is referred to as "upward direction".

The light-emitting element layer 2 includes, on a first electrode 4, a first charge transport layer 6, a light-emitting layer 8 as a quantum dot layer, a second charge transport layer 10, and a second electrode 12, which are sequentially layered from the lower layer. The first electrode 4 of the light-emitting element layer 2 formed in the upper layer of the array substrate 3 is electrically connected to the TFT of the array substrate 3. In the present embodiment, the first electrode 4 is an anode electrode and the second electrode 12 is a cathode electrode, for example.

In the present embodiment, the light-emitting element layer 2 includes a first light-emitting element 2R, a second light-emitting element 2G, and a third light-emitting element 2B. The first light-emitting element 2R, the second light-emitting element 2G, and the third light-emitting element 2B are quantum-dot light emitting diode (QLED) elements in which the light-emitting layer 8 includes a semiconductor nanoparticle material, that is, a quantum dot material, and the quantum dot material is caused to emit light in the light-emitting layer 8.

Each of the first electrode 4, the first charge transport layer 6, and the light-emitting layer 8 is separated by edge covers 14. In particular, in the present embodiment, the first electrode 4 is, by the edge covers 14, separated into a first electrode 4R for the first light-emitting element 2R, a first electrode 4G for the second light-emitting element 2G, and a first electrode 4B for the third light-emitting element 2B. The first charge transport layer 6 is, by the edge covers 14, separated into a first charge transport layer 6R for the first light-emitting element 2R, a first charge transport layer 6G for the second light-emitting element 2G, and a first charge transport layer 6B for the third light-emitting element 2B. Further, the light-emitting layer 8 is, by the edge covers 14, separated into a first light-emitting layer 8R, the second light-emitting layer 8G, and a third light-emitting layer 8B.

The second charge transport layer 10 and the second electrode 12 are not separated by the edge covers 14, and are each formed in a shared manner. As illustrated in FIG. 1B, the edge covers 14 may be formed at the positions to cover side surfaces of the first electrode 4 and the vicinity of peripheral end portions of an upper face thereof.

In the present embodiment, the first light-emitting element 2R includes the first electrode 4R, the first charge transport layer 6R, the first light-emitting layer 8R, the second charge transport layer 10, and the second electrode 12. The second light-emitting element 2G includes the first electrode 4G, the first charge transport layer 6G, the second light-emitting layer 8G, the second charge transport layer 10, and the second electrode 12. Furthermore, the third light-emitting element 2B includes the first electrode 4B, the first charge transport layer 6B, the third light-emitting layer 8B, the second charge transport layer 10, and the second electrode 12.

In the present embodiment, the first light-emitting layer 8R, the second light-emitting layer 8G, and the third light-emitting layer 8B emit red light that is light of a first color, green light that is light of a second color, and blue light that is light of a third color, respectively. In other words, the first light-emitting element 2R, the second light-emitting element 2G, and the third light-emitting element 2B are light-emitting elements that emit the red light, the green light, and the blue light, respectively, which are different colors from each other.

Here, the blue light refers to, for example, light having a light emission central wavelength in a wavelength band of equal to or greater than 400 nm and equal to or less than 500 nm. The green light refers to, for example, light having a light emission central wavelength in a wavelength band of greater than 500 nm and equal to or less than 600 nm. The red light refers to, for example, light having a light emission central wavelength in a wavelength band of greater than 600 nm and equal to or less than 780 nm.

The first electrode 4 and the second electrode 12 include conductive materials and are electrically connected to the first charge transport layer 6 and the second charge transport layer 10, respectively. Of the first electrode 4 and the second electrode 12, the electrode closer to the light-emitting face DS is a transparent electrode.

In particular, in the present embodiment, the array substrate 3 is a transparent substrate, and the first electrode 4 is a transparent electrode. The second electrode 12 may be a reflective electrode. Therefore, light from the light-emitting layer 8 passes through the first charge transport layer 6, the first electrode 4, and the array substrate 3, and is emitted from the light-emitting face DS to the outside of the light-emitting device 1. Due to this, the light-emitting device 1 is configured as a bottom-emitting type light-emitting device. Since both the light emitted in the upward direction from the light-emitting layer 8 and the light emitted in the downward direction from the light-emitting layer 8 are available as light emission from the light-emitting device 1, the light-emitting device 1 can improve the usage efficiency of the light emitted from the light-emitting layer 8.

Note that the configuration of the first electrode 4 and the second electrode 12 described above is an example, and may be configured with other materials.

The first charge transport layer 6 is a layer that transports charges from the first electrode 4 to the light-emitting layer 8. The first charge transport layer 6 may have a function of inhibiting the transport of charges from the second electrode 12. In the present embodiment, the first charge transport layer 6 may be a hole transport layer that transports positive holes from the first electrode 4, which is an anode electrode, to the light-emitting layer 8.

The second charge transport layer 10 is a layer that transports the charge from the second electrode 12 to the light-emitting layer 8. The second charge transport layer 10 may have a function of inhibiting the transport of the charges from the first electrode 4. In the present embodiment, the second charge transport layer 10 may be an electron transport layer that transports electrons from the second electrode 12, which is a cathode electrode, to the light-emitting layer 8.

Next, the configuration of the light-emitting layer 8 will be described in detail with reference to FIG. 1C. Note that, FIG. 1C is a schematic cross-sectional view of the region B in FIG. 1B, that is, a schematic cross-sectional view of the periphery of the second light-emitting layer 8G of the second light-emitting element 2G. However, in the present embodiment, unless otherwise indicated, members illustrated in FIG. 1C are considered to have configurations common to each of the light-emitting elements. Accordingly, in the present embodiment, unless otherwise indicated, the members illustrated in FIG. 1C may have the same configurations as those in each of the light-emitting elements.

In the present embodiment, the light-emitting layer 8 includes a first quantum dot 16, a second quantum dot 17, and a ligand 18. The first quantum dot 16 includes a quantum dot 20. The quantum dot 20 has a core/shell structure including a core 22 and a first shell 24, with which the periphery of the core 22 is coated. The first quantum dot 16 includes a second shell 26. The second shell 26 coats a periphery of the first shell 24 that is an outer shell of each quantum dot 20.

The quantum dot 20 may have a multi-shell structure in which a plurality of shells are provided around the core 22. In this case, the first shell 24 refers to a shell corresponding to the outermost layer among the plurality of shells.

The ligand 18 coordinates with the first quantum dot 16 on an outer surface of the second shell 26. Further, the ligand 18 also coordinates with the second quantum dot 17 on an outer surface of the second quantum dot 17. The ligand 18 may be, for example, trioctylphosphine oxide (TOPO).

As illustrated in FIG. 1C, in the present embodiment, the ligand 18 is interposed between adjacent first quantum dots 16. That is, adjacent first quantum dots 16 are separated from each other. Note that, among the quantum dots 20, at least one set of quantum dots 20 adjacent to each other may be connected to each other via the second shell 26. The first shell 24 and the second shell 26 have a crystal structure, and in particular, in the present embodiment, the second shell 26 has a crystal structure formed by epitaxial growth on the first shell 24. Therefore, the above-described quantum dots 20 connected to each other are connected by a crystal structure of the second shell 26. Note that all the quantum dots 20 within an identical light-emitting element may be connected to each other by the crystal structure of the second shell 26 to form an integral quantum dot structure. The first shell 24 and the second shell 26 may be polycrystalline.

The core 22 and first shell 24 of the quantum dot 20 may include an inorganic material used for the quantum dots of a known core/shell structure. In other words, the first light-emitting layer 8R, the second light-emitting layer 8G, and the third light-emitting layer 8B may include known quantum dot materials used for light-emitting layers of red, green, and blue QLED elements, respectively.

In addition, similar to the first shell 24, the second shell 26 may include an inorganic shell material used for the quantum dots of a known core/shell structure. The first shell 24 and the second shell 26 may be made of the same material. Note that a specific resistance of the second shell 26 is preferably equal to or greater than a specific resistance of the first shell 24. Further, the size of a band gap of the second shell 26 is preferably greater than the size of a band gap of the first shell 24. With this configuration, the efficiency of charge injection from the second shell 26 to the first shell 24 is improved.

Examples of specific materials for the core 22 include group II-VI semiconductors such as CdSe (band gap 1.73 eV), CdTe (band gap 1.44 eV), ZnTe (band gap 2.25 eV), and CdS (band gap 2.42 eV). Examples of other specific materials for the core 22 include the group III-V such as InP (band gap 1.35 eV) and InGaP (band gap 1.88 eV).

In general, the wavelength emitted by the quantum dot is determined by the particle diameter of the core. Therefore, it is preferable to employ a semiconductor material having an appropriate band gap as a material of the core 22 in order to control the light emitted from the core 22 to be any of red, green, and blue colors, by controlling the particle diameter of the core 22.

The band gap of the material of the core 22 included in the first light-emitting layer 8R is preferably equal to or lower than 1.97 eV in order for the first light-emitting layer 8R serving as a red light-emitting layer to emit red light having a wavelength of 630 nm. In order for the second light-emitting layer 8G serving as a green light-emitting layer to emit green light having a wavelength of 532 nm, the band gap of the material of the core 22 included in the second light-emitting layer 8G is preferably equal to or lower than 2.33 eV. Furthermore, in order for the third light-emitting layer 8B serving as a blue light-emitting layer to emit blue light having a wavelength of 630 nm, the band gap of the material of the core 22 included in the third light-emitting layer 8B is preferably equal to or lower than 2.66 eV. The light-emitting device 1 provided with the first light-emitting layer 8R, the second light-emitting layer 8G, and the third light-emitting layer 8B is preferable from the perspective of satisfying the color space criteria in the International Standard BT 2020 of UHDTV.

Examples of specific materials for the first shell 24 and the second shell 26 include the group II-VI such as ZnSe (band gap 2.7 eV) and ZnS (band gap 3.6 eV), and the group III-V such as GaP (band gap 2.26 eV).

The material of the core 22 preferably has low specific resistance and a less band gap compared to the material of the first shell 24 and the second shell 26. With this configuration, the efficiency of charge injection from the first shell 24 and second shell 26 to the core 22 is improved.

Note that, in the present embodiment, an average film thickness of the first shell 24 from the outer surface of the core 22 is less than a minimum film thickness of the second shell 26. Here, the minimum film thickness of the second shell 26 refers to a film thickness of the second shell 26 between two quantum dots 20 connected to each other via the second shell 26, or the least film thickness of a film thickness from the first shell 24 to the outer surface of the second shell 26.

Here, the shortest distance from the core 22 of one quantum dot 20 to the core 22 of another quantum dot 20 adjacent thereto is preferably equal to or greater than 3 nm when the core 22 is made of InP, and the first shell 24 and second shell 26 are made of ZnS, for example. For example, when the core 22 is made of CdSe, and the first shell 24 and second shell 26 are made of ZnS, the shortest distance is preferably equal to or greater than 1 nm. With this configuration, the electron exudation from the core 22, derived from the electron wave function, may be efficiently reduced by the first shell 24 and the second shell 26.

In the present embodiment, the quantum dot 20 absorbs light having a shorter wavelength than a wavelength of light emitted from itself. In particular, the quantum dot 20 absorbs ultraviolet light. Furthermore, the quantum dot 20 generates heat when absorbing light.

The second quantum dot 17 is formed of the same material as the second shell 26. A part of the charge injected into the light-emitting layer 8 is injected into the first quantum dot 16 via the second quantum dot 17. Thus, the charge injected into the light-emitting layer 8 is easily injected into the first quantum dot 16. As a result, the luminous efficiency in the light-emitting device 1 can be improved.

Figure 2:
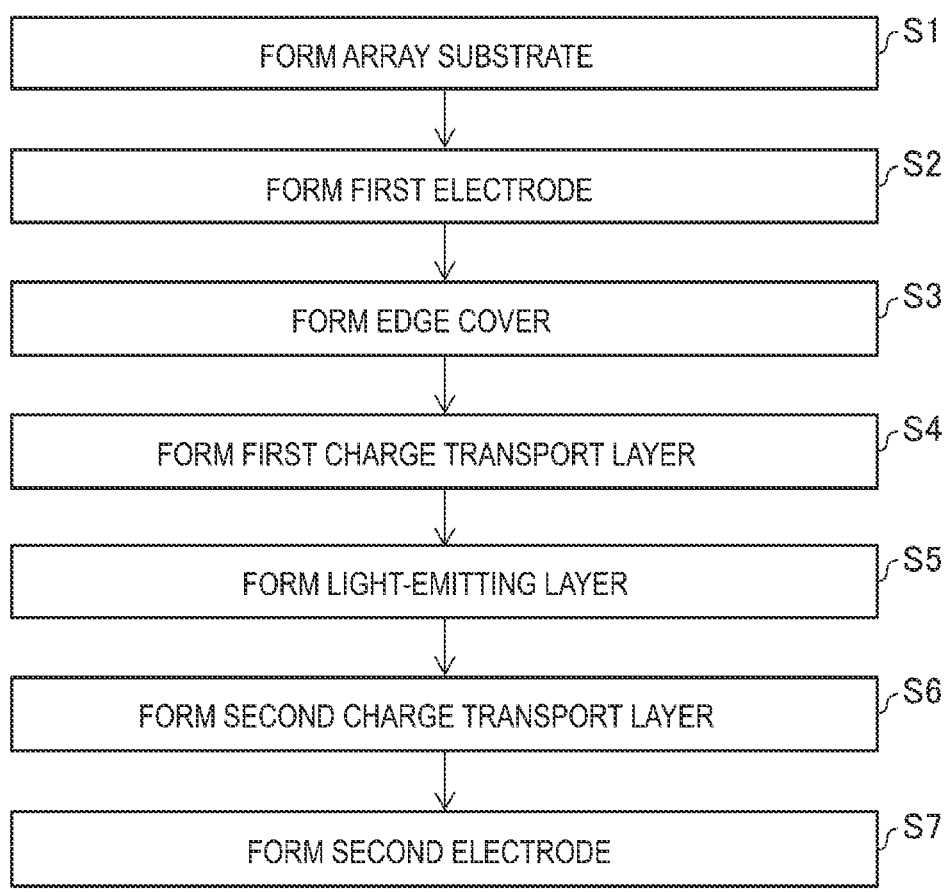
FIG. 2 is a flowchart for describing a method for manufacturing the light-emitting device according to the first embodiment.

Next, a method for manufacturing the light-emitting device 1 according to the present embodiment will be described with reference to FIG. 2. FIG. 2 is a flowchart for describing the method for manufacturing the light-emitting device 1 according to the present embodiment.

First, the array substrate 3 is formed (step S1). Formation of the array substrate 3 may be performed by forming a plurality of TFTs on the substrate to match positions of the subpixels.

Next, the first electrode 4 is formed (step S2). In step S2, for example, after a transparent electrode material having electrical conductivity, such as ITO, is film-formed by sputtering, the first electrode 4 may be formed for each subpixel by patterning while matching a shape of the subpixel. Alternatively, the first electrode 4 may be formed for each subpixel by vapor-depositing a transparent electrode material by using a vapor deposition mask.

Next, the edge covers 14 are formed (step S3). The edge covers 14, after being applied on the array substrate 3 and the first electrode 4, may be obtained by patterning while leaving the positions covering the side surfaces and peripheral end portions of the first electrodes 4 between the adjacent first electrodes 4. The patterning of the edge covers 14 may be performed by photolithography.

Next, the first charge transport layer 6 is formed (step S4). The first charge transport layer 6 may be formed for each subpixel by separately patterning with an ink-jet method, vapor deposition using a mask, or patterning using photolithography.

Next, the light-emitting layer 8 is formed (step S5). The step of forming the light-emitting layer 8 will be described in more detail with reference to FIGS. 3 to 6.

Figure 3:
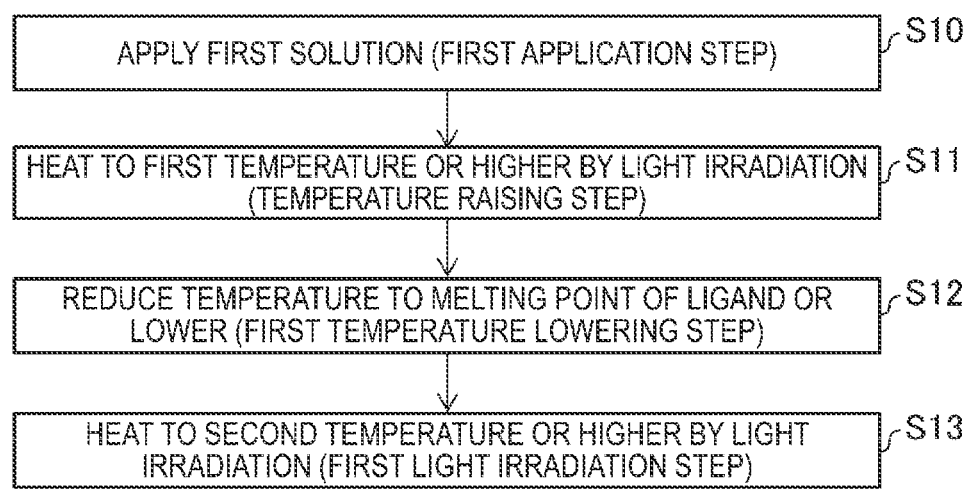
FIG. 3 is a flowchart for describing a method for forming the light-emitting layer according to the first embodiment.

FIG. 3 is a flowchart for describing the step of forming the light-emitting layer corresponding to a step of forming a quantum dot layer in the present embodiment.

Figure 4:
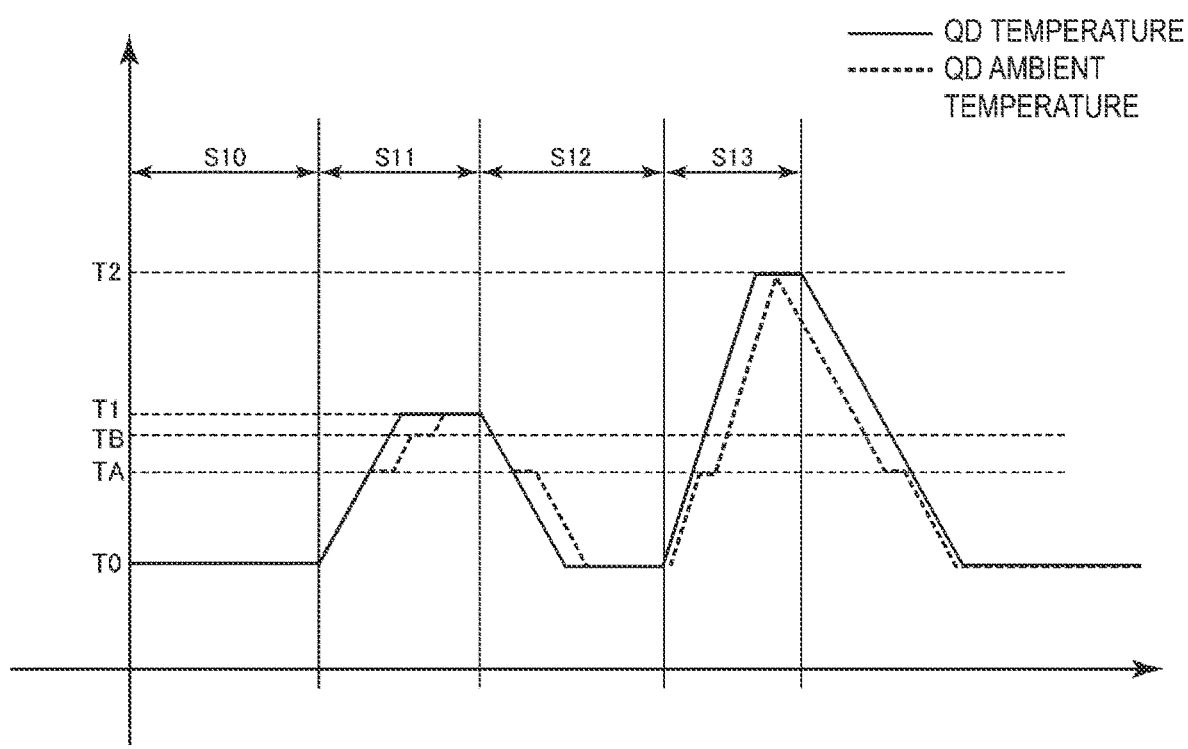
FIG. 4 is a graph for describing a relationship between an elapsed time and a temperature in a step of forming the light-emitting layer according to the first embodiment.

FIG. 4 is a graph for describing a relationship between an elapsed time and a temperature in the step of forming the light-emitting layer. In FIG. 4, the horizontal axis represents the elapsed time of the step of forming the light-emitting layer, and the vertical axis represents the temperature. A solid line in FIG. 4 indicates a temperature of the quantum dots 20 on the array substrate 3, a broken line indicates a temperature around the quantum dots 20, and a dotted line indicates a temperature of the ligand 18 except for the ligand 18 disposed around the quantum dots 20.

Figure 5:
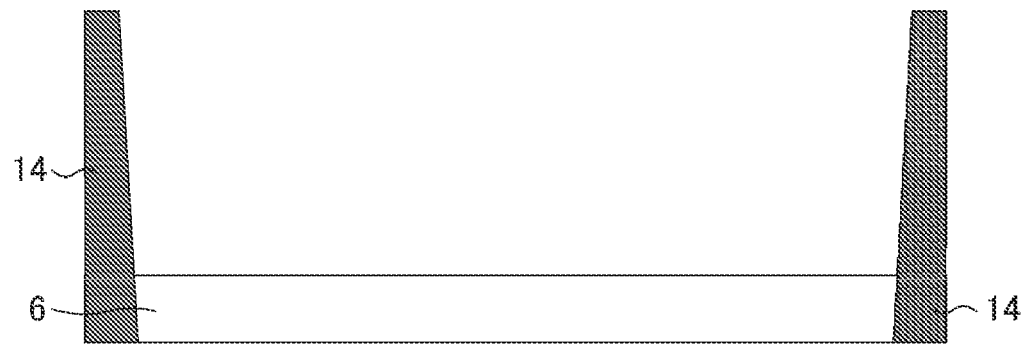
FIGS. 5A and 5B are forming-step cross-sectional views for describing the step of forming the light-emitting layer according to the first embodiment.
Figure 5:
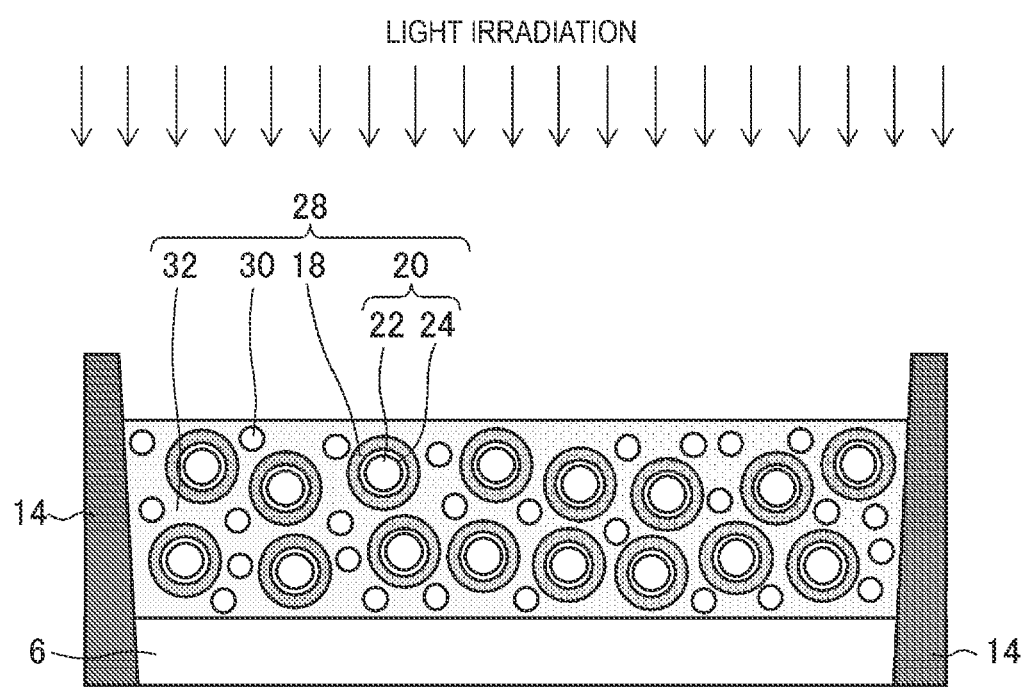
Figure 6:
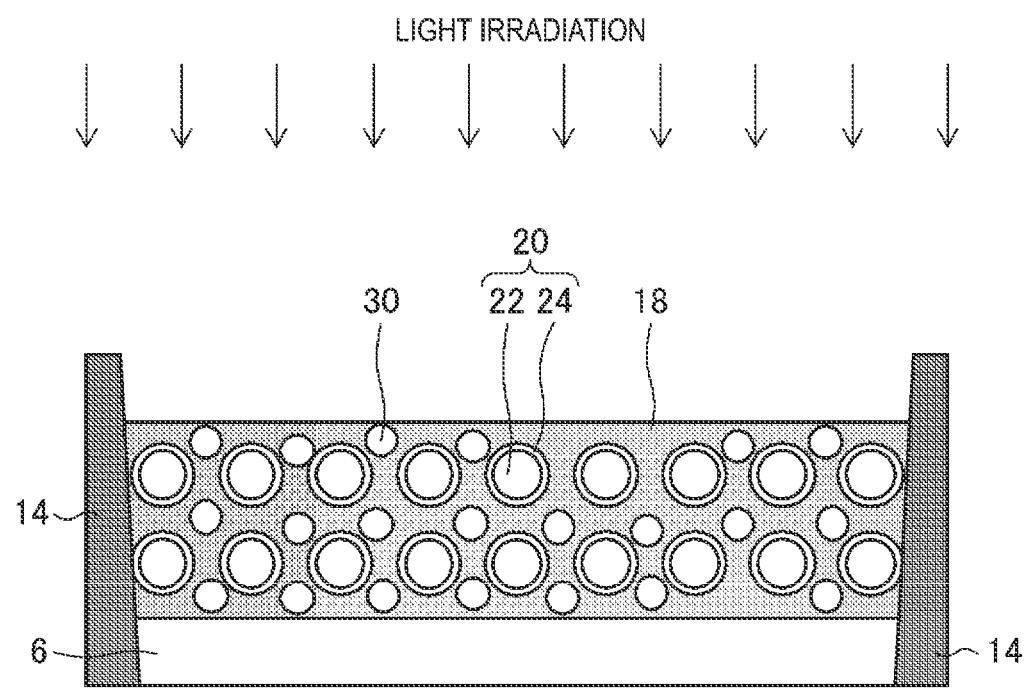
FIGS. 6A and 6B are other forming-step cross-sectional views for describing the step of forming the light-emitting layer according to the first embodiment.
Figure 6:
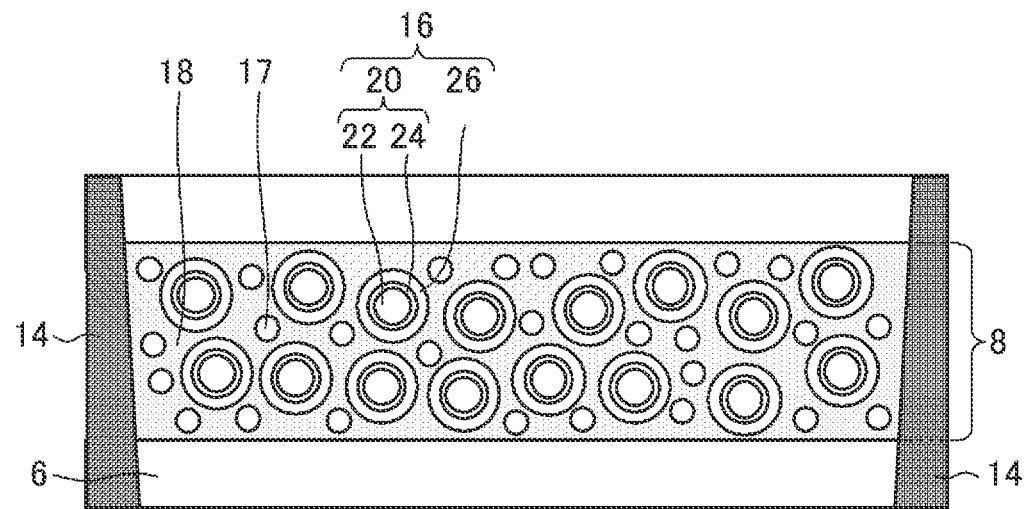

FIGS. 5 and 6 are forming-step cross-sectional views for describing the step of forming the light-emitting layer. Hereinafter, each of the forming-step cross-sectional views including FIGS. 5 and 6 of the present specification illustrates the forming-step cross-sectional view of the region B in FIG. 1B, that is, the forming-step cross-sectional view at the position corresponding to the periphery of the second light-emitting layer 8G of the second light-emitting element 2G, unless otherwise specified. However, the techniques described with reference to the forming-step cross-sectional views in the present specification may be applied to the method for forming the light-emitting layer 8 of the other light-emitting elements, unless otherwise specified.

As illustrated in FIG. 5A, the formation up to a first charge transport layer 6 has been performed on the array substrate 3 until the step of forming the light-emitting layer. In the step of forming the light-emitting layer, first, a step of first application is performed in which a first solution 28 illustrated in FIG. 5B is applied on a position overlapping with the array substrate 3 (step S10).

The first solution 28 is a solution in which the plurality of quantum dots 20 with the ligand 18 being coordinated and a first inorganic precursor 30 are dispersed in a first solvent 32, as illustrated in FIG. 5B. The first solvent 32 may be, for example, hexane. The first inorganic precursor 30 contains the same material as the second shell 26 described above. The first inorganic precursor 30 may contain, for example, zinc chloride and 1-Dodecanethiol.

The step of the first application is performed at an atmospheric temperature of a temperature T0, as illustrated in FIG. 4. Since the application of the first solution 28 is performed at the atmospheric temperature of the temperature T0, the temperature of the quantum dots 20 in the first solution 28 to be applied and an ambient temperature of the quantum dots 20 also take the temperature T0, as illustrated in FIG. 4. The temperature T0 may be, for example, an ordinary temperature.

Subsequently, a step of temperature raising is performed in which light irradiation is performed to irradiate the first solution 28 on the array substrate 3 with light such as ultraviolet light so as to heat the quantum dots 20 (step S11). In the step of the temperature raising, the quantum dots 20 are heated until the quantum dots 20 have a first temperature T1 or higher as indicated in FIG. 4. The step of the temperature raising may be performed by baking the array substrate.

The first temperature T1 is a temperature higher than a melting point of the ligand 18 and a boiling point of the first solvent 32. A temperature TA indicated in FIG. 4 is the melting point of the ligand 18, and a temperature TB is the boiling point of the first solvent 32. The first temperature T1 and the temperature TA are higher than the temperature T0. Note that the temperature TA may be the boiling point of the first solvent 32, and the temperature TB may be the melting point of the ligand 18.

The melting point of TOPO is in a range from 50 degrees Celsius to 54 degrees Celsius, and the boiling point of hexane is in a range from 68.5 degrees Celsius to 69.1 degrees Celsius. Accordingly, in a case where the ligand 18 is TOPO and the first solvent is hexane, the temperature TA is the melting point of the TOPO, and the first temperature T1 is the boiling point of the hexane.

The ambient temperature of the quantum dots 20 follows a rise of the temperature of the quantum dots 20 with a slight delay, as depicted in FIG. 4, until the temperature of the quantum dots 20 rises from the temperature T0 to the temperature TA. However, when the ambient temperature of the quantum dots 20 rises up to the temperature TA and one of the melting of the ligand 18 and the evaporation of the first solvent 32 begins, the ambient temperature of the quantum dots 20 maintains the temperature TA for a while.

By further carrying on the step of the temperature raising, the melting of the ligand 18 ends, and the ambient temperature of the quantum dots 20 begins to rise again. Then, when the ambient temperature of the quantum dots 20 rises up to the temperature TB and the other one of the melting of the ligand 18 and the evaporation of the first solvent 32 begins, the ambient temperature of the quantum dots 20 maintains the first temperature T1 for a while.

Thus, the melting of the ligand 18 and the evaporation of the first solvent 32 are completed by the step of the temperature raising. When the first temperature T1 is the boiling point of the first solvent 32, in the step of the temperature raising, the first solvent 32 vaporizes after the ligand 18 has melted. On the other hand, when the first temperature T1 is the melting point of the ligand 18, in the step of the temperature raising, the ligand 18 melts after the first solvent 32 has vaporized.

In a case where the melting of the ligand 18 is earlier than the vaporization of the first solvent 32, immediately after the vaporization of the first solvent 32, aggregate of the quantum dots 20, around which the solid ligand 18 is attached, is formed in an upper layer relative to the first charge transport layer 6. Since the aggregate is unstable as a film, it is difficult for the first inorganic precursor 30 to be present in some case. Accordingly, in the step of the temperature raising, from the perspective of forming a stable film including the quantum dots 20 and the first inorganic precursor 30, it is preferable that the first solvent 32 vaporize after the melting of the ligand 18.

After the completion of the step of the temperature raising, as illustrated in FIG. 6A, the first solvent 32 has vaporized from above the array substrate 3, and the quantum dots 20 and the first inorganic precursor 30 are dispersed in the melted ligand 18.

Next, a step of first temperature lowering is performed in which the temperature of the array substrate 3 is lowered to the melting point of the ligand 18 or lower (step S12). The step of the first temperature lowering may be performed by storing the array substrate 3 in a cooling environment, or the array substrate 3 may be naturally cooled by stopping the step of the temperature raising.

By carrying on the step of the first temperature lowering, first, the temperature of the quantum dots 20 is lowered from the first temperature T1 to the temperature TA. When the temperature of the quantum dots 20 reaches the temperature TA, solidification of the melted ligand 18 begins. Then, the ambient temperature of the quantum dots 20 maintains the temperature TA until the solidification of the ligand 18 is completed. By further carrying on the step of the first temperature lowering, the solidification of the ligand 18 is completed, and then the ambient temperature of the quantum dots 20 follows a decrease of the temperature of the quantum dots 20 with a slight delay, and reaches the temperature T0.

Subsequently, a step of first light irradiation is performed in which first light irradiation is performed on the position where the first solution 28 has been applied on the array substrate 3 so as to heat the quantum dots 20 (step S13). In the step of the first light irradiation, the first light irradiation is continued until the temperature of the quantum dots 20 reaches a second temperature T2 indicated in FIG. 4. In the first light irradiation, ultraviolet light may be emitted as in light irradiation in the step of the temperature raising, or light having a greater amount of energy per unit time than the light emitted in the step of the temperature raising may be emitted.

By carrying on the step of the first light irradiation, first, the temperature of the quantum dots 20 reaches the temperature TA. When the temperature TA is reached, the ligand 18 around the quantum dots 20 of the solidified ligand 18 is melted again. Then, the ambient temperature of the quantum dots 20 maintains the temperature TA until the melting of the ligand 18 around the quantum dots 20 is completed, and follows the temperature of the quantum dots 20 with a slight delay. Here, the first solvent 32 has already been evaporated. Thus, the ambient temperature of the quantum dots 20 is not affected by the temperature TB.

Subsequently, in the step of the first light irradiation, the temperature of the quantum dots 20 maintains a temperature at approximately the second temperature T2 from the point in time when the temperature of the quantum dots 20 reaches the second temperature T2. Herein, ultraviolet light may be emitted as in the light irradiation in the step of the temperature raising and the first light irradiation, or light having a less amount of energy per unit time than the light emitted in the first light irradiation may be emitted. Since the temperature of the quantum dots 20 is maintained at the second temperature T2, the ambient temperature of the quantum dots 20 after having reached the second temperature T2 is also maintained at the second temperature T2.

In each of the steps of light irradiation in the present embodiment, when an amount of heat generated in the quantum dots 20 and an amount of heat dissipated toward the peripheral environment of the array substrate 3 are balanced, the temperature around the quantum dots 20 is substantially constant at a certain temperature.

The second temperature T2 is higher than the first temperature T1, and is a temperature at which the first inorganic precursor 30 epitaxially grows around the first shell 24 by thermochemical reaction. Thus, while the ambient temperature of the quantum dots 20 is maintained at the second temperature T2, the first inorganic precursor 30 gradually grows epitaxially around the first shell 24. With this, the second shell 26 is formed around the first shell 24 of each quantum dot 20, as illustrated in FIG. 6B. Further, the first inorganic precursor 30 remaining in the ligand 18 becomes the second quantum dot 17 made of the same material as the second shell 26 in the ligand 18. When the first inorganic precursor 30 contains zinc chloride and 1-Dodecanethiol as discussed above, the second temperature T2 is approximately 200 degrees Celsius.

As described above, as illustrated in FIG. 6B, the first quantum dot 16 including the quantum dot 20 and the second shell 26 is formed. After this, the light irradiation with respect to the array substrate 3 is stopped and cooling is carried out, whereby the melted ligand 18 is solidified again. In this way, the light-emitting layer 8 illustrated in FIG. 6B including the first quantum dot 16, the second quantum dot 17, and the ligand 18 is obtained.

Note that in the present embodiment, the step of forming the light-emitting layer 8 is described with reference to the enlarged cross-sectional view of the periphery of the second light-emitting layer 8G. However, a difference in the forming method of each of the first light-emitting layer 8R, second light-emitting layer 8G, and third light-emitting layer 8B is only a difference in the materials contained in the first solution 28. That is, regardless of luminescent colors of the light-emitting layer 8 to be formed, the steps of the first application, the temperature raising, the first temperature lowering, and the first light irradiation may be implemented by the same method.

In the step of the first application, the material contained in the first solution 28 may be changed for each luminescent color of the corresponding light-emitting element, and the first solution 28 may be subjected to separately patterning by an ink-jet method. Specifically, the first solution 28 may be separately applied by an ink-jet method on a position overlapping with each of the first electrodes 4 formed for each light-emitting element. Then, the steps of the temperature raising, the first temperature lowering, and the first light irradiation described above may be performed. As a result, in the step of the first light irradiation, the light-emitting elements having mutually different luminescent colors can be formed by continuous single light irradiation.

Note that the concentration of the first inorganic precursor 30 in the first solution 28 applied in the step of the first application may vary depending on the luminescent color of the corresponding light-emitting element. In particular, the concentration of the first inorganic precursor 30 in the first solution 28 applied on the position corresponding to the second light-emitting element 2G is preferably lower than the concentration of the first inorganic precursor 30 in the first solution 28 applied on the position corresponding to the first light-emitting element 2R. Furthermore, the concentration of the first inorganic precursor 30 in the first solution 28 applied on the position corresponding to the second light-emitting element 2G is preferably higher than the concentration of the first inorganic precursor 30 in the first solution 28 applied on the position corresponding to the third light-emitting element 2B.

In the step of epitaxially growing the second shell 26 around the quantum dot 20, when the amount of light irradiation is the same, the amount of the first inorganic precursor 30 needed for forming the second shell 26 having the same film thickness increases as a particle size of the quantum dot 20 increases. In general, as a wavelength of light emitted from the quantum dot 20 increases, a particle size of the core 22, and thus a particle size of the quantum dot 20 increases.

Therefore, as in the configuration described above, with a longer wavelength of light emitted from the corresponding light-emitting element, a formation condition of each light-emitting layer can be brought closer by increasing the concentration of the first inorganic precursor 30 in the first solution 28. Thus, a variation in film thickness of the second shell 26 can be suppressed between the quantum dots 20 having particle sizes different from each other.

In the step of forming the light-emitting layer, after the first solution 28 is applied on a position overlapping with the first electrode 4 in the step of the first application, partial exposure by laser irradiation may be performed in each of the step of the temperature raising and the step of the first light irradiation. Thereafter, a step of removal may be performed in which the first solution 28 is removed from a position overlapping with a position different from the position where the partial exposure was performed. As a result, the light-emitting layer 8 may be formed only at the position partially exposed by the laser irradiation.

Furthermore, in the step of forming the light-emitting layer, after the first solution 28 is applied on a position overlapping with the first electrode 4 in the step of the first application, partial exposure using a photomask may be performed in each of the step of the temperature raising and the step of the first light irradiation. A method for forming the light-emitting layer 8 by partial exposure using a photomask will be described in more detail with reference to FIGS. 7 and 8.

Figure 7:
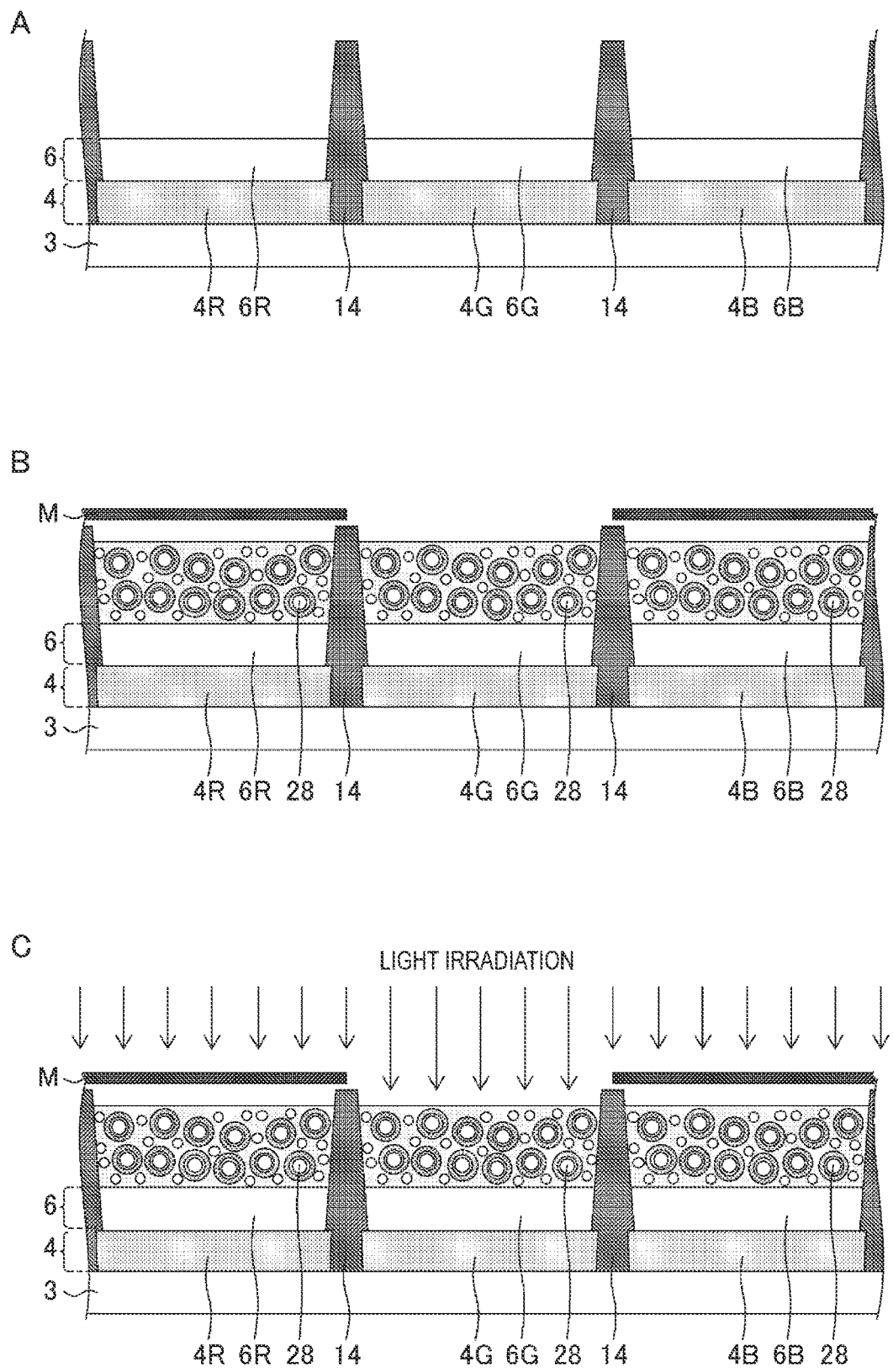
FIGS. 7A to 7C are forming-step cross-sectional views for describing light irradiation using a photomask in the step of forming the light-emitting layer according to the first embodiment.
Figure 8:
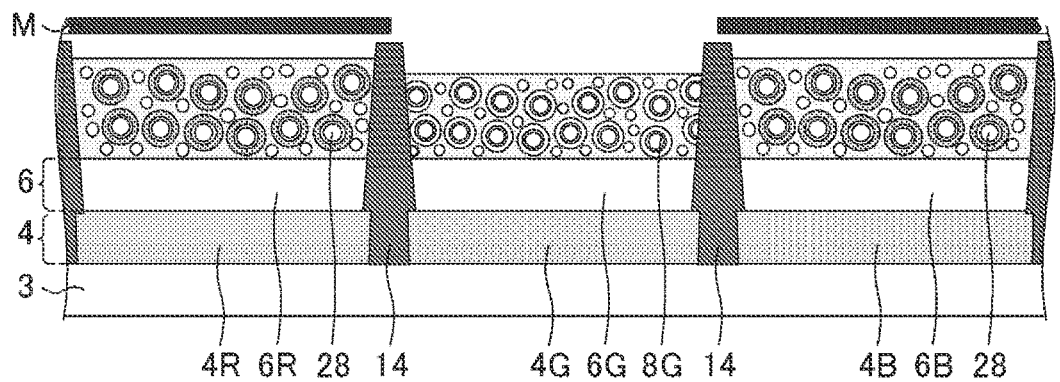
FIGS. 8A to 8C are other forming-step cross-sectional views for describing light irradiation using a photomask in the step of forming the light-emitting layer according to the first embodiment.
Figure 8:
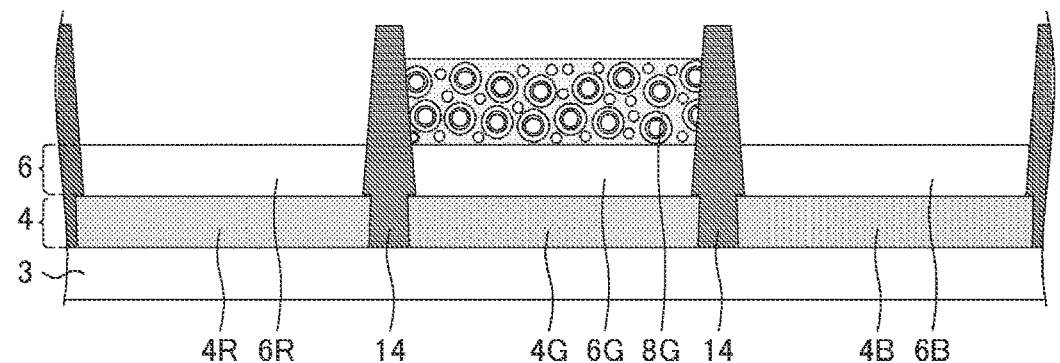
Figure 8:
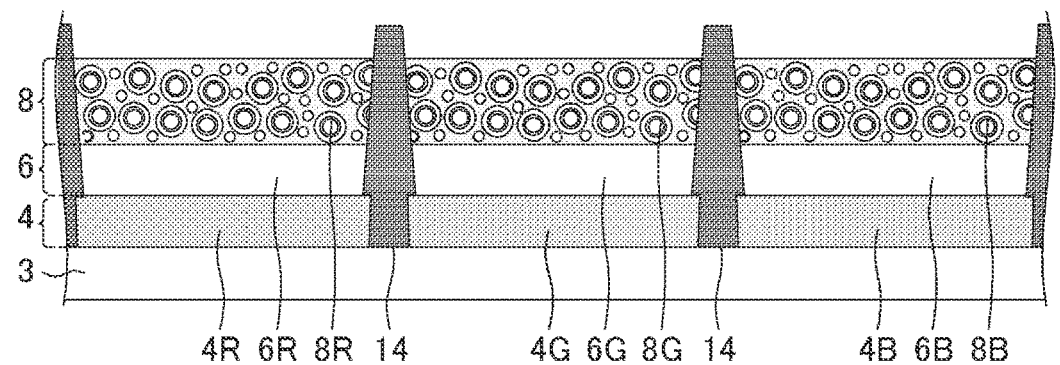

FIGS. 7 and 8 are forming-step cross-sectional views for describing a technique for forming the light-emitting layer 8 by partial exposure using a photomask in the step of forming the light-emitting layer. Note that FIGS. 7 and 8 illustrate not only a position where the second light-emitting layer 8G is formed, but also illustrates a position where the first light-emitting layer 8R and the third light-emitting layer 8B are formed.

As illustrated in FIG. 7A, the first electrode 4 and the first charge transport layer 6 that are partitioned by the edge covers 14 are formed on the array substrate 3 immediately before the step of forming the light-emitting layer is performed. Here, a photomask M illustrated in FIG. 7B is installed between the step of the first application and the step of temperature raising.

The photomask M has a function of shielding light emitted in the step of the temperature raising and the step of the first light irradiation. When the photomask M is installed above the array substrate 3, an opening is formed such that the opening is formed only in a position overlapping with the first electrode 4G. That is, as illustrated in FIG. 7B, when the photomask M is installed above the array substrate 3, the top of the first solution 28 in a position that does not overlap with the first electrode 4G is shielded by the photomask M.

By performing the step of the temperature raising to the step of the first light irradiation after the photomask M is installed, light irradiation is performed only on the first solution 28 in the position overlapping with the first electrode 4G, as illustrated in FIG. 7C. Thus, in the step of the temperature raising and the step of the first light irradiation, the quantum dots 20 are heated only in the position overlapping with the first electrode 4G. Therefore, as illustrated in FIG. 8A, the second light-emitting layer 8G is formed only in the position overlapping with the first electrode 4G.

Next, after the photomask M is removed from above the array substrate 3, as illustrated in FIG. 8B, a step of removal is performed in which the first solution 28 is removed from a position overlapping with a position different from the position where the light irradiation is performed. In this way, a step of forming the second light-emitting layer 8G is completed.

Note that, in the step of forming the light-emitting layer, when the partial exposure using laser irradiation or a photomask described above is adopted as a technique for each light irradiation, the step of the first application to the step of the removal described above may be repeatedly performed according to the luminescent color of the corresponding light-emitting element. For example, after the second light-emitting layer 8G illustrated in FIG. 8B is formed, the step of the first application to the step of the removal may be performed two more times in a total of three times for forming the first light-emitting layer 8R and the third light-emitting layer 8B.

Here, according to a kind of the light-emitting layer 8 to be formed, a kind of a solution applied in the step of the first application is changed, and the photomask M installed above the array substrate 3 is also changed. Specifically, in the step of the temperature raising and the step of the first light irradiation, a position of an opening in the photomask M is changed according to a kind of the light-emitting layer 8 such that the light irradiation is performed only on a position overlapping with a position of the light-emitting layer 8 to be formed.

As described above, the light-emitting layer 8 illustrated in FIG. 8C including the first light-emitting layer 8R, the second light-emitting layer 8G, and the third light-emitting layer 8B is formed.

Note that, in the present embodiment, the technique for forming the light-emitting layer 8 partitioned by the edge covers 14 for each light-emitting element has been described. However, when partial exposure using laser irradiation or a photomask is adopted for each light irradiation, light irradiation can be individually performed on a position overlapping with each of the first electrodes 4. Thus, even when the light-emitting layer 8 is not partitioned by the edge covers 14, the light-emitting layer 8 corresponding to each light-emitting element can be formed individually. Therefore, when partial exposure is adopted in each light irradiation, a height of the edge covers 14 may be a height that covers the edge of the first electrode 4.

Note that, in the present embodiment, the method for forming the light-emitting layer 8 in each of the first light-emitting element that emits red light, the second light-emitting element that emits green light, and the third light-emitting element that emits blue light in the step of forming the light-emitting layer described above has been described. However, the step of forming the light-emitting layer described above can be applied to the step of forming the light-emitting layer 8 when a part of the light-emitting element is provided with the light-emitting layer 8 of a kind different from another part of the light-emitting element.

In the present embodiment, the time for performing the first light irradiation on the position corresponding to each of the first light-emitting element 2R, the second light-emitting element 2G, and the third light-emitting element 2B may vary depending on the luminescent color of the light-emitting element. In particular, the irradiation time of the first light irradiation for the position corresponding to the second light-emitting element 2G is preferably shorter than the irradiation time of the first light irradiation for the position corresponding to the first light-emitting element 2R. Furthermore, the irradiation time of the first light irradiation for the position corresponding to the second light-emitting element 2G is preferably longer than the irradiation time of the first light irradiation for the position corresponding to the third light-emitting element 2B.

When the first solution 28 is subjected to separately patterning by an ink-jet method in the step of the first application, and the light irradiation is performed on the entire coating region, the photomask may be installed above the array substrate 3 and the light irradiation may be started again in the middle of the step of the first light irradiation. In this way, the irradiation time of the first light irradiation can be changed according to the luminescent color of the light-emitting element. When the partial exposure described above is performed, the irradiation time of the first light irradiation may be set different in each partial exposure.

In the step of epitaxially growing the second shell 26 around the quantum dot 20, a growing speed of the second shell 26 is slower as a particle size of the quantum dot 20 increases. That is, when the second shell 26 having the same film thickness is formed around the quantum dot 20, time required for the first light irradiation increases as a particle size of the quantum dot 20 increases.

Therefore, as in the configuration described above, a formation condition of each light-emitting layer can be brought closer between the plurality of light-emitting elements by setting different times of the light irradiation according to the luminescent color of the corresponding light-emitting element. Thus, a variation in film thickness of the second shell 26 can be suppressed between the quantum dots 20 having particle sizes different from each other.

Subsequent to the step of forming the light-emitting layer, the second charge transport layer 10 is formed (step S6). The second charge transport layer 10 may be applied and formed in common to all of the subpixels by a spin coat technique or the like.

Finally, the second electrode 12 is formed (step S7). The second electrode 12 may be film-formed in common to all of the subpixels by vapor deposition or the like. As described above, the light-emitting element layer 2 is formed on the array substrate 3, and the light-emitting device 1 is obtained.

In the method for manufacturing the light-emitting device 1 according to the present embodiment, after the quantum dot 20 having the core/shell structure is applied, the second shell 26 epitaxially grows around the first shell 24 of each quantum dot 20. Thus, a film thickness of the shell in each quantum dot 20 can be made thicker than that when the quantum dots 20 having the core/shell structure are simply layered.

For example, in a quantum dot having the core/shell structure, it is conceivable to increase a film thickness of a shell in order to reduce exudation of electrons injected into the core of the quantum dot. However, when quantum dots having a thick film thickness of a shell are layered to form quantum dots, a filling rate of the quantum dots is low with respect to the volume of a light-emitting layer. Thus, it is difficult to achieve sufficient density of the quantum dots in the light-emitting layer, resulting in a decrease in luminous efficiency of a light-emitting element.

In the method for manufacturing the light-emitting device 1 according to the present embodiment, the quantum dot 20 including a thin first shell 24 is applied, and the second shell 26 is then formed on each quantum dot 20. In the light-emitting layer 8 according to the present embodiment, a film thickness of the shell formed around the core 22 can be considered as a total film thickness of the first shell 24 and the second shell 26.

As a result, the density of the quantum dots 20 in the light-emitting layer 8 can be enhanced compared to the case of simply layering the quantum dots provided with the shells having the same film thickness. Thus, while reducing the electron exudation from the quantum dot 20, the density of the quantum dots 20 in the light-emitting layer 8 is improved, thereby resulting in an improvement in luminous efficiency of the light-emitting device 1.

In the present embodiment, since at least one set of quantum dots 20 is connected via the second shell 26, an area of the outer surface of the second shell 26 is smaller in the above one set of quantum dots 20 than that in the case of not being connected. That is, in the present embodiment, an area of the outer surface of the first quantum dot 16 can be reduced compared to the case of simply layering quantum dots.

By reducing the area of the outer surface of the first quantum dot 16, the area of the surface of the second shell 26, through which moisture may infiltrate from the outside, can be reduced. Accordingly, this configuration may reduce damage to the second shell 26 due to the moisture infiltration, and may consequently suppress degradation in a surface protection function of the quantum dot 20 of the second shell 26 due to the damage described above.

When the ligand 18 coordinates on the outer surface of the first quantum dot 16, the reduction of the area of the outer surface makes it possible to reduce the ligand 18 possible to be damaged by the moisture infiltration. Accordingly, the damage to the second shell 26 can be reduced due to the loss of the protection function by the ligand 18 for the second shell 26 due to the damage described above.

By reducing the area of the outer surface of the first quantum dot 16, the surface area of the second shell 26 possible to be damaged can be reduced when the light-emitting device 1 is driven. Thus, the above-discussed configuration may reduce damage to the second shell 26 accompanying the drive of the light-emitting device 1, and may consequently reduce the formation of defects in the second shell 26 due to the damage. As a result, by reducing the area of the outer surface of the first quantum dot 16, the occurrence of a non-emitting process caused by recombination of electrons and holes in the defects is suppressed, and consequently a decrease in luminous efficiency of the light-emitting device 1 is suppressed.

As described above, because of the outer surface of the first quantum dot 16 being small, the area of the outer surface of the first quantum dot 16 possible to be damaged can be reduced, and reduce deactivation of the quantum dot 20 due to damage to the first quantum dot 16.

According to NPL 1, the average value of a random close packing ratio in the packing of rigid spheres is approximately 63.66 percent. Accordingly, in the present embodiment, the proportion of the volume of the first quantum dots 16 in the light-emitting layer 8 is preferably greater than or equal to 63.7 percent. With the above configuration, the density of the quantum dots 20 in the light-emitting layer 8 can be enhanced compared to the case of randomly layering quantum dots each provided with a shell whose film thickness is equal to the total film thickness of the first shell 24 and second shell 26. Furthermore, with the configuration described above, the area of the outer surface of the first quantum dot 16 can more efficiently be decreased compared to the case of randomly layering quantum dots.

In the present embodiment, an average film thickness of the first shell 24 from the outer surface of the core 22 is less than a minimum film thickness of the second shell 26. Thus, the quantum dots 20 can be more densely layered between the step of the temperature raising and the step of the first light irradiation, and the second shell 26 having a relatively thick film thickness can be formed in the subsequent step of the first light irradiation.

Therefore, in the step of the light irradiation, the first shell 24 and the second shell 26 having a film thickness that can sufficiently reduce the electron exudation from the core 22, derived from the electron wave function can be formed, while the quantum dots 20 are densely layered. Thus, according to this configuration, the density of the quantum dots 20 in the first quantum dots 16 can be increased while sufficiently ensuring a film thickness of the first shell 24 and the second shell 26.

In the present embodiment, the light-emitting layer 8 is formed after the formation of the array substrate 3, the first electrode 4, the edge covers 14, and the first charge transport layer 6. However, heating for forming the light-emitting layer 8 is achieved by the heat generation of the quantum dots 20 by light irradiation. Thus, local heating of the light-emitting layer 8 is achieved. Accordingly, the array substrate 3, the first electrode 4, the edge covers 14, and the first charge transport layer 6 do not necessarily need to have high heat resistance with respect to heating in the light irradiation step described above. Therefore, the array substrate 3, the first electrode 4, the edge covers 14, and the first charge transport layer 6 may contain a known material in the related art.

The array substrate 3 may be, for example, a glass substrate containing alkali glass or the like. Further, the array substrate 3 may be an organic substrate containing an organic material such as polyimide. Further, the array substrate 3 may contain a flexible material such as PET, and may achieve a flexible light-emitting device 1.

For example, when the light-emitting element layer 2 forms a bottom-emitting type light-emitting element and the first electrode 4 is an anode electrode, ITO is commonly used for the first electrode 4. When the first charge transport layer 6 is a hole transport layer, an inorganic material such as NiO, MgNiO, $Cr_2O_3$, $Cu_2O$, or $LiNbO_3$ may be contained.

In order to achieve a shape having a certain level of height and inclination, an organic material is generally used for the edge cover 14. In the present embodiment, the edge cover 14 may contain polyimide or the like.

For example, the second charge transport layer 10 may contain a material used for a known electron transport layer in the related art, and the second electrode 12 may contain a material used for a known cathode electrode in the related art.

Second Embodiment

Figure 9:
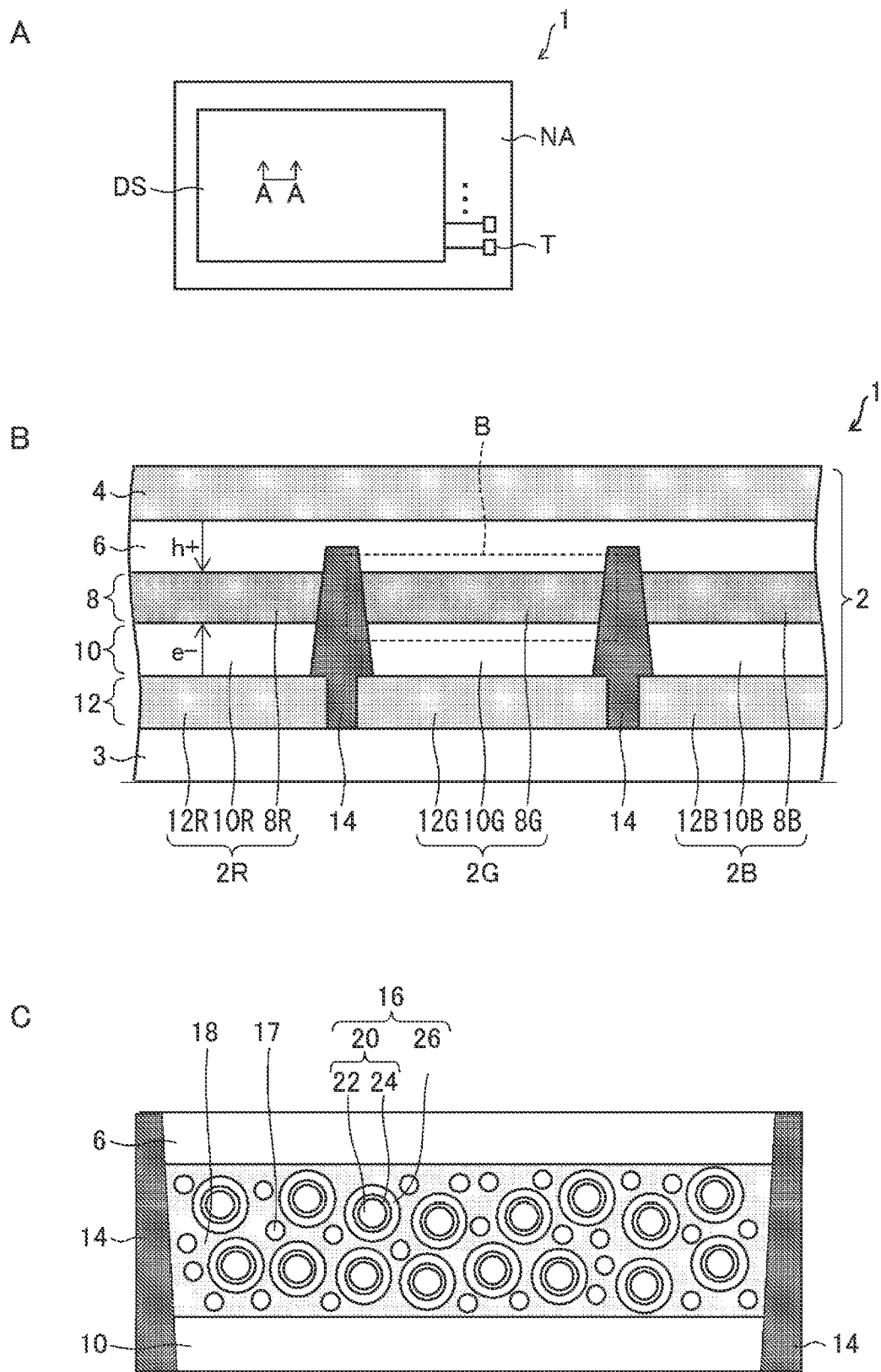
FIG. 9A is a schematic top view of a light-emitting device according to a second embodiment.
FIG. 9B is a schematic cross-sectional view of the light-emitting device according to the second embodiment.
FIG. 9C is a schematic enlarged view of a periphery of a light-emitting layer of the light-emitting device according to the second embodiment.

FIG. 9A is a schematic top view of a light-emitting device 1 according to the present embodiment. FIG. 9B is a cross-sectional view taken along a line A-A in FIG. 9A. FIG. 9C is an enlarged cross-sectional view of a region B in FIG. 9B.

The light-emitting device 1 according to the present embodiment may have the same configuration as that of the light-emitting device 1 according to the previous embodiment except that the layering order of each of the layers in a light-emitting element layer 2 is reversed. In other words, the light-emitting element layer 2 according to the present embodiment includes a second charge transport layer 10, a light-emitting layer 8, a first charge transport layer 6, and a first electrode 4, which are sequentially layered from the lower layer on a second electrode 12.

In comparison with the light-emitting device 1 according to the previous embodiment, each of the second electrode 12 and the second charge transport layer 10 is separated by edge covers 14. In particular, in the present embodiment, the second electrode 12 is, by the edge covers 14, separated into a second electrode 12R for a first light-emitting element 2R, a second electrode 12G for a second light-emitting element 2G, and a second electrode 12B for a third light-emitting element 2B. Further, the second charge transport layer 10 is, by the edge covers 14, separated into a second charge transport layer 10R for the first light-emitting element 2R, a second charge transport layer 10G for the second light-emitting element 2G, and a second charge transport layer 10B for the third light-emitting element 2B.

In comparison with the light-emitting device 1 according to the previous embodiment, the first charge transport layer 6 and the first electrode 4 are not separated by the edge covers 14, and are each formed in a shared manner.

In the present embodiment, the first electrode 4 may be a transparent electrode and the second electrode 12 may be a reflective electrode. Therefore, light from the light-emitting layer 8 passes through the first charge transport layer 6 and the first electrode 4, and is emitted from a light-emitting face DS to the outside of the light-emitting device 1. Due to this, the light-emitting device 1 is configured as a top-emitting type light-emitting device. Because of this, in the present embodiment, an array substrate 3 need not necessarily be a transparent substrate.

The light-emitting device 1 according to the present embodiment can be manufactured by performing each of the steps illustrated in FIG. 2 in the order of step S1, step S7, step S3, step S6, step S5, step S4, and step S2 in a similar manner to that of the previous embodiment. Thus, in the present embodiment, the light-emitting layer 8 is formed after the formation of the array substrate 3, the second electrode 12, the edge covers 14, and the second charge transport layer 10.

For example, when the light-emitting element layer 2 forms a top-emitting type light-emitting element and the second electrode 12 is a cathode electrode, the second electrode 12 preferably has a function of also reflecting light emitted in each light irradiation described above. According to the configuration, in each light irradiation described above, not only light directly emitted to the quantum dots 20, but also light that has reached the second electrode 12 once and is reflected by the second electrode 12 can be effectively used as light in each light irradiation. Thus, the step of the light irradiation in the present embodiment can reduce intensity of the light irradiation required to irradiate the quantum dots 20 with sufficient light compared to the step of the light irradiation in the previous embodiment.

From the perspective of enhancing light reflectivity of light emitted in the light irradiation described above, it is preferable to contain a metal material. The second electrode 12 may contain at least a metal thin film having light reflectivity on the surface. For example, the second electrode 12 may contain a metal such as Al or Ag, or an intermetallic compound such as AgMg.

Third Embodiment

Figure 10:
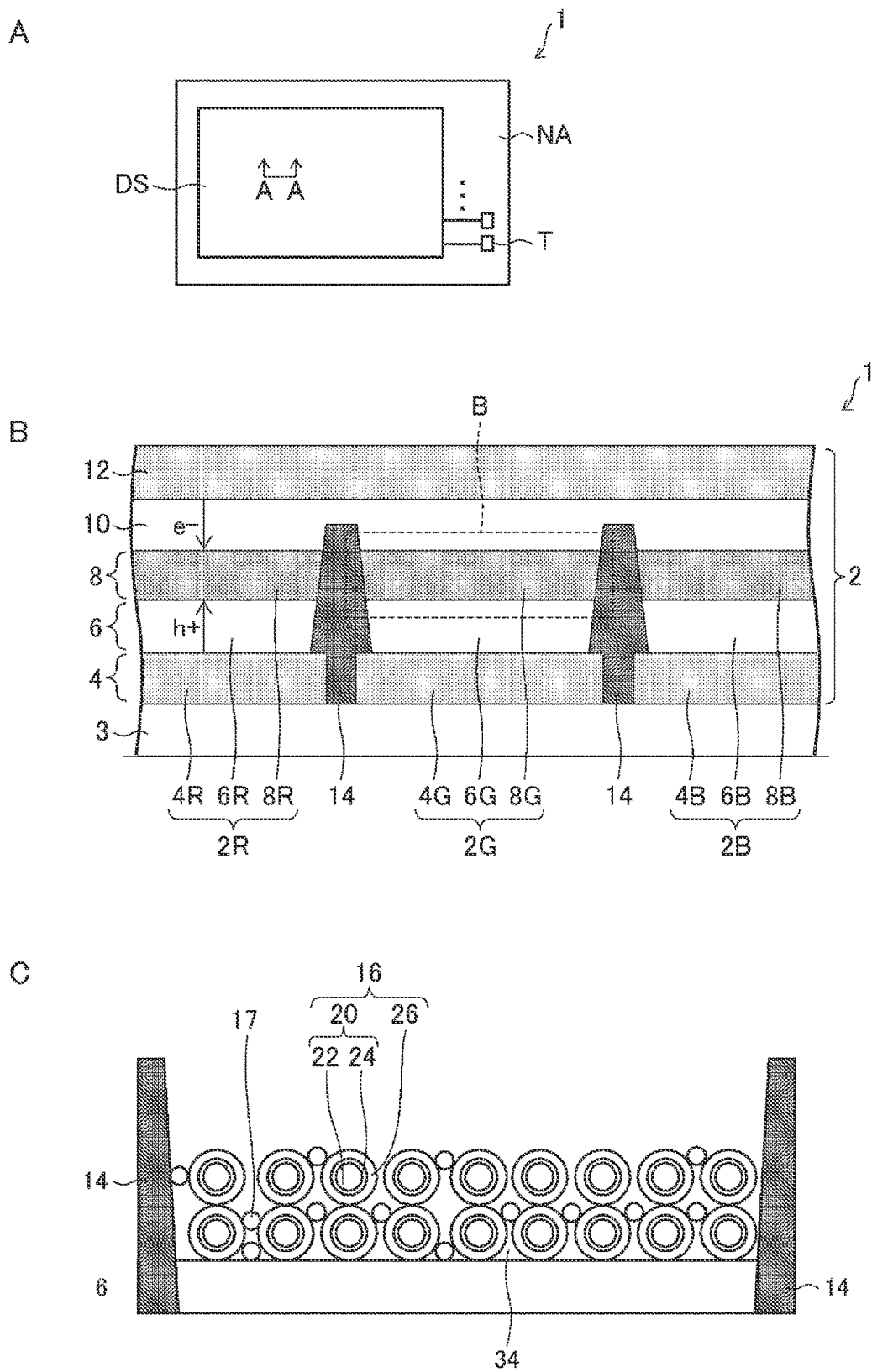
FIG. 10A is a schematic top view of a light-emitting device according to a third embodiment.
FIG. 10B is a schematic cross-sectional view of the light-emitting device according to the third embodiment.
FIG. 10C is a schematic enlarged view of a periphery of a light-emitting layer of the light-emitting device according to the third embodiment.

FIG. 10A is a schematic top view of a light-emitting device 1 according to the present embodiment. FIG. 10B is a cross-sectional view taken along a line A-A in FIG. 10A. FIG. 10C is an enlarged cross-sectional view of a region B in FIG. 10B.

The light-emitting device 1 according to the present embodiment may have the same configuration as that of the light-emitting device 1 of the first embodiment except that a light-emitting layer 8 does not include a ligand 18. As illustrated in FIG. 10C, the light-emitting layer 8 may include a void 34 in a space not filled with a first quantum dot 16 and a second quantum dot 17.

The light-emitting device 1 according to the present embodiment is manufactured by the same method except for step S5, that is, the step of forming the light-emitting layer among the steps illustrated in FIG. 2. The step of forming the light-emitting layer of the light-emitting device 1 according to the present embodiment will be described in more detail with reference to FIGS. 11 to 13.

Figure 11:
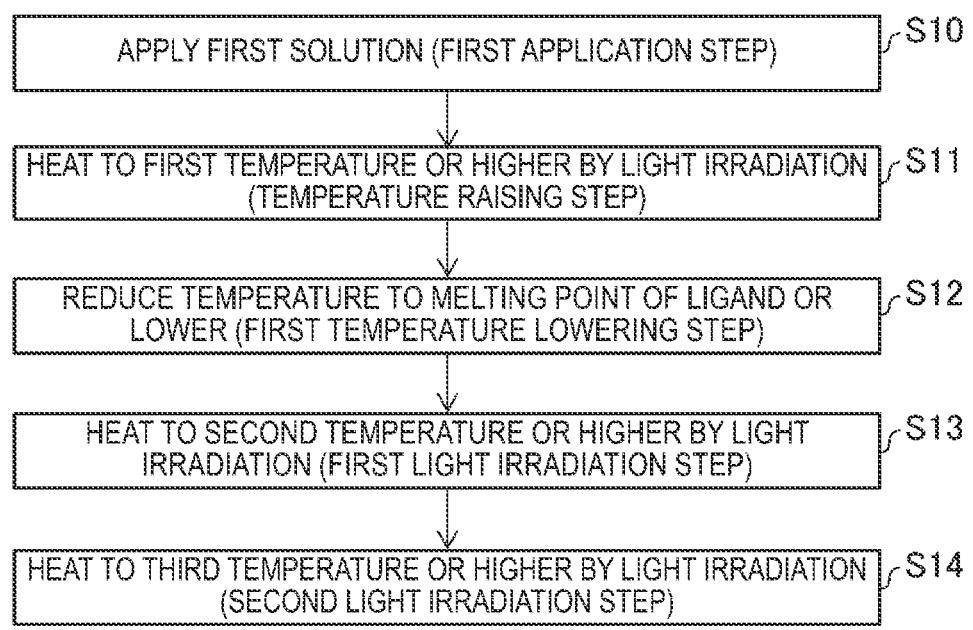
FIG. 11 is a flowchart for describing a method for forming the light-emitting layer according to the third embodiment.
Figure 12:
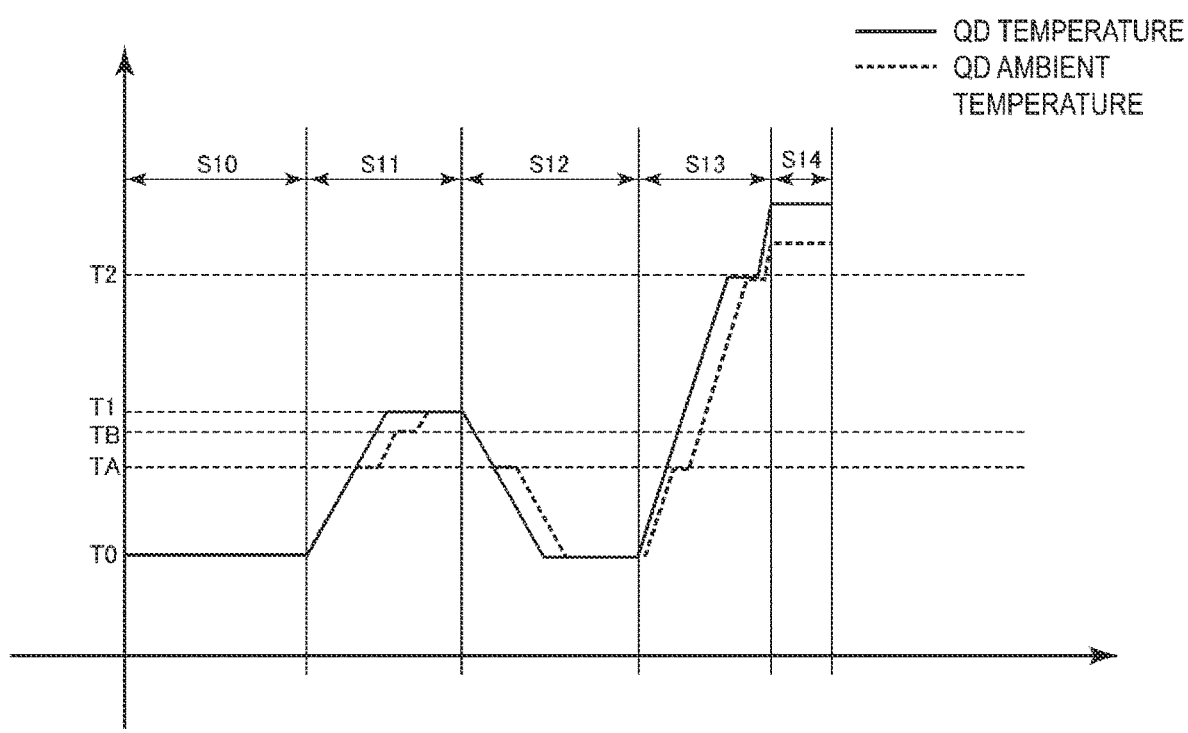
FIG. 12 is a graph for describing a relationship between an elapsed time and a temperature in a step of forming the light-emitting layer according to the third embodiment.
Figure 13:
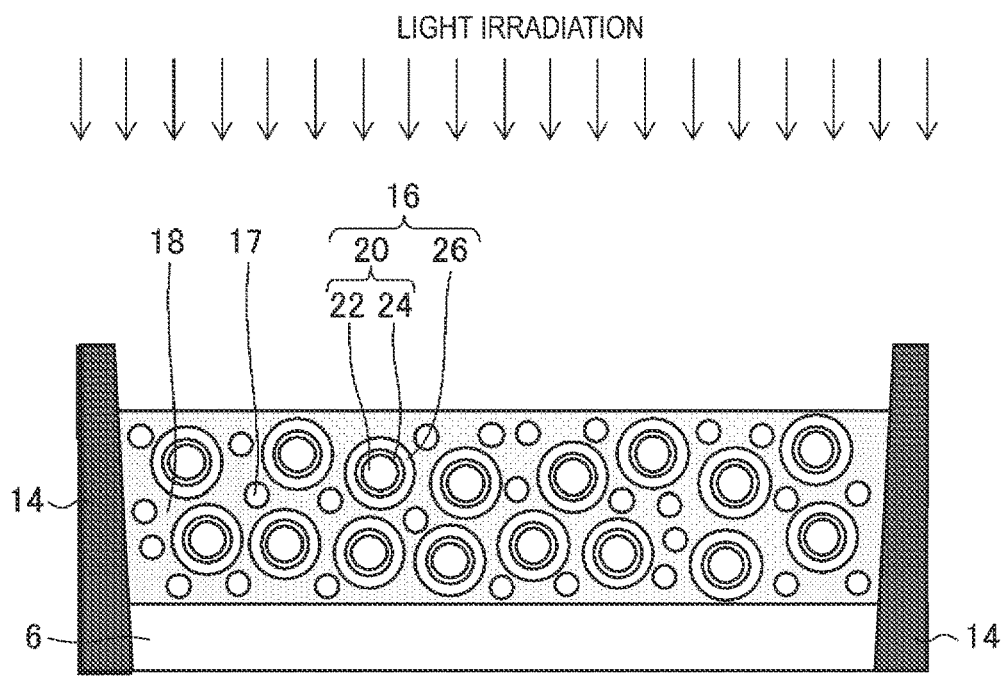
FIGS. 13A and 13B are forming-step cross-sectional views for describing the step of forming the light-emitting layer according to the third embodiment.
Figure 13:
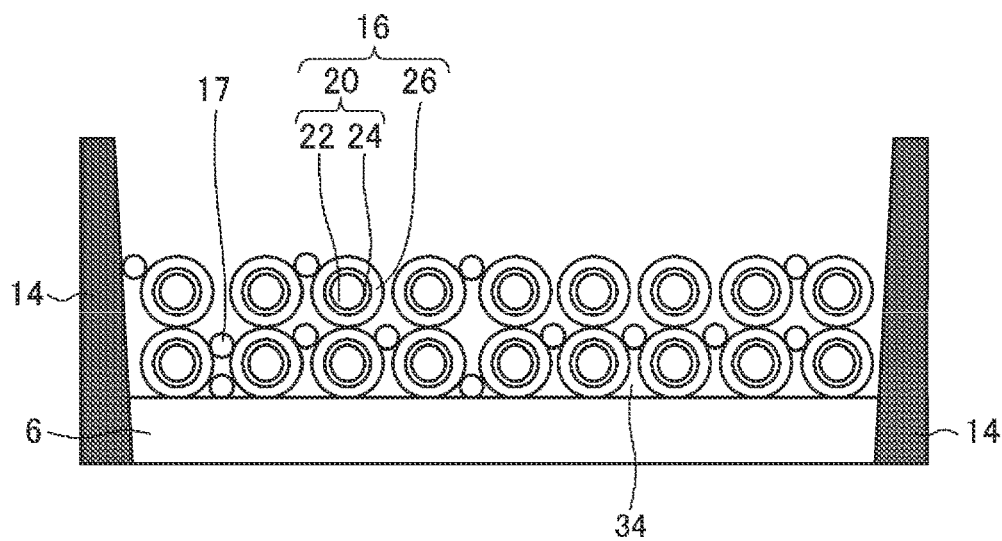

FIG. 11 is a flowchart for describing the step of forming the light-emitting layer corresponding to a step of forming a quantum dot layer in the present embodiment. FIG. 12 is a graph for describing a relationship between an elapsed time and a temperature in the step of forming the light-emitting layer. Similar to FIG. 4, a solid line in FIG. 12 depicts a temperature of quantum dots 20 on an array substrate 3, and a broken line depicts a temperature around the quantum dots 20. FIG. 13 is a forming-step cross-sectional view for describing the step of forming the light-emitting layer.

In the step of forming the light-emitting layer according to the present embodiment, the same method as that described in the first embodiment is performed from step S10 to step S13. At the point in time of the completion of step S13, the first quantum dot 16, the second quantum dot 17, and the ligand 18 are formed in an upper layer relative to a first charge transport layer 6, as illustrated in FIG. 13A.

In the present embodiment, subsequent to step S13, a step of second light irradiation is performed in such a manner that second light irradiation is additionally performed to heat the quantum dots 20 so that the temperature of the quantum dots 20 becomes a temperature equal to or higher than a third temperature T3 (step S14). In the second light irradiation, ultraviolet light may be emitted as in the step of the temperature raising and the first light irradiation, or light having a greater amount of energy per unit time than the light emitted in the first light irradiation may be emitted. The third temperature T3 is higher than the second temperature T2, and is equivalent to a boiling point of the ligand 18. For example, in the case where the ligand 18 is the aforementioned TOPO, the third temperature T3 is 411.2 degrees Celsius.

When the ambient temperature of the quantum dots 20 reaches the third temperature T3 by heating the quantum dots 20 in the step of the second light irradiation, evaporation of the ligand 18 begins and the ambient temperature of the quantum dots 20 maintains the third temperature T3 for a while. Thus, in the step of the second light irradiation, the ligand 18 vaporizes, thereby obtaining the light-emitting layer 8 without the ligand 18 as illustrated in FIG. 13B.

Note that, in the step of the temperature raising and the step of the first light irradiation performed prior to the step of the second light irradiation in the present embodiment, the partial exposure using laser irradiation or a photomask described in the first embodiment may be adopted for each light irradiation. In this case, after the step of the first application to the step of the removal are repeatedly performed according to the luminescent color of the corresponding light-emitting element, the second light irradiation described above may be performed on a position overlapping with a position where the first solution is applied in the step of the first application.

In this way, after the light-emitting layer 8 including the ligand 18 is formed for each luminescent color of the light-emitting element, the ligand 18 in the light-emitting layer 8 can be vaporized at once. Thus, according to the configuration described above, the number of times of performing the second light irradiation can be reduced compared to the case of individually performing the second light irradiation, thereby resulting in a reduction in manufacturing cost.

The light-emitting device 1 according to the present embodiment does not include the ligand 18 in the light-emitting layer 8. Generally, a ligand that coordinates with quantum dots often includes an organic material. Thus, the light-emitting layer 8 according to the present embodiment that does not include the ligand 18 has a low content of an organic material with respect to an inorganic material, and is resistant to deterioration due to moisture permeation or the like. Therefore, the light-emitting device 1 according to the present embodiment can further improve reliability.

Here, from the description of NPL 1 described above, the average value of the proportion of the voids that are not occupied by rigid spheres in the randomly closest packed space of the rigid spheres is approximately 36.34 volume percent. Therefore, for example, a volume ratio of an organic matter to an inorganic matter in the light-emitting layer 8 is preferably equal to or less than 36.3 volume percent. In this case, a proportion of the organic matter in the light-emitting layer 8 can be reduced compared to a case of a light-emitting layer in which known quantum dots are randomly closest packed and a void between the quantum dots is filled with an organic ligand. Therefore, with the configuration described above, the reliability of the light-emitting layer 8 can be more efficiently improved.

Note that, in the present specification, expression of "not including a ligand" refers to not substantially including a ligand. For example, the light-emitting layer 8 in the present embodiment may have a residue of impurities or ligands being left to the extent that the reliability of the light-emitting layer 8 is not significantly reduced. Specifically, the light-emitting layer 8 in the present embodiment may have a residue of the impurities or the ligands described above that is approximately 3 volume percent of the entire volume of the light-emitting layer 8.

Also in the present embodiment, similarly to the embodiments described above, the area of the outer surface of the first quantum dot 16 can be reduced. In this way, the surface area of the second shell 26 possible to be damaged by the light irradiation and the heat generation of the quantum dots 20 due to the light irradiation in the step of the second light irradiation in the present embodiment can be reduced. Thus, with this configuration, as described above, formation of a defect in the second shell 26 due to damage to the second shell 26, and thus a decrease in luminous efficiency of the light-emitting device 1 due to the defect can be reduced.

Fourth Embodiment

Figure 14:
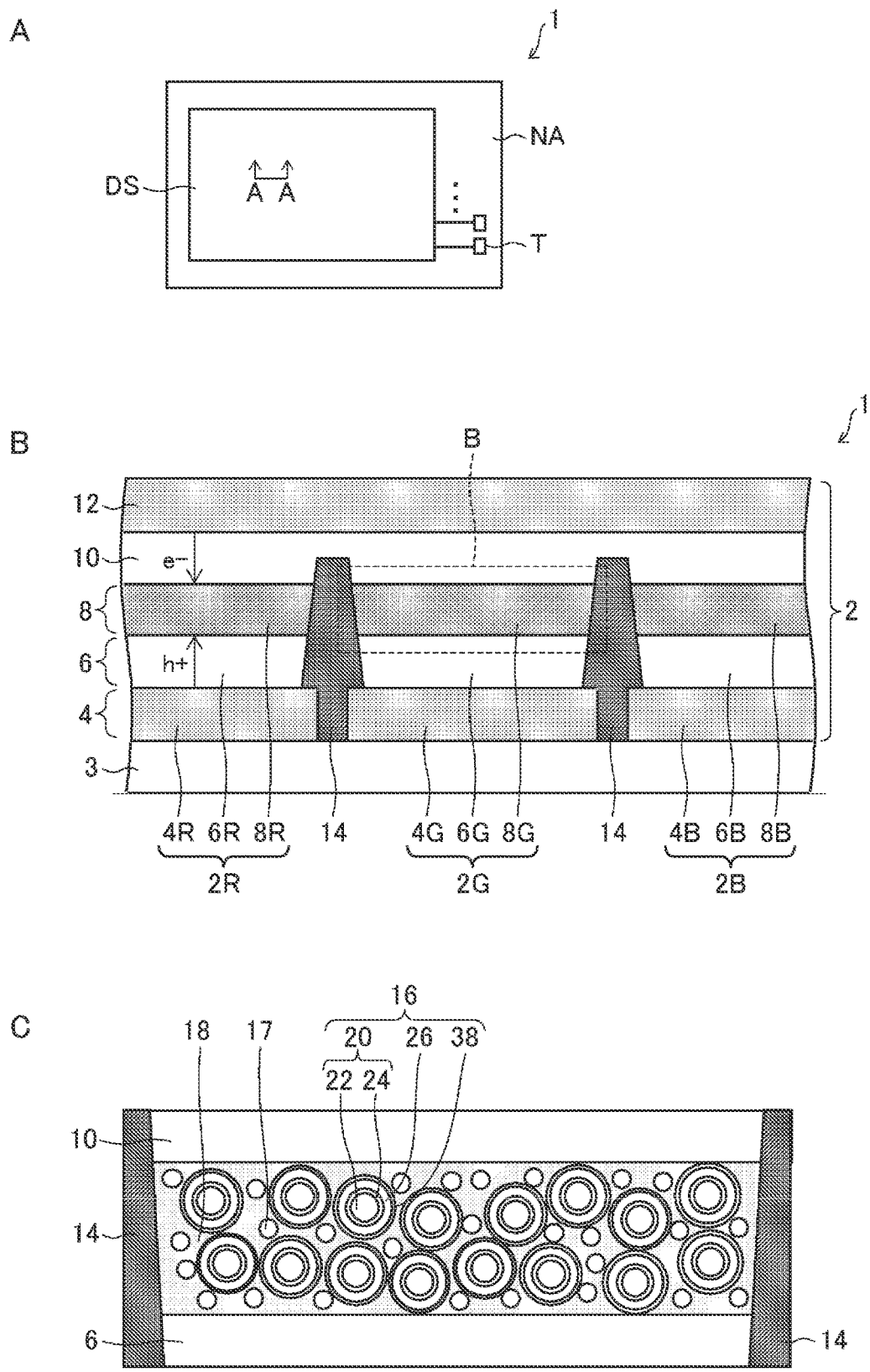
FIG. 14A is a schematic top view of a light-emitting device according to a fourth embodiment.
FIG. 14B is a schematic cross-sectional view of the light-emitting device according to the fourth embodiment.
FIG. 14C is a schematic enlarged view of a periphery of a light-emitting layer of the light-emitting device according to the fourth embodiment.

FIG. 14A is a schematic top view of a light-emitting device 1 according to the present embodiment. FIG. 14B is a cross-sectional view taken along a line A-A in FIG. 14A. FIG. 14C is an enlarged cross-sectional view of a region B in FIG. 14B.

The light-emitting device 1 according to the present embodiment may have the same configuration as that of the light-emitting device 1 according to the previous embodiments except that a first quantum dot 16 in a light-emitting layer 8 is different.

As illustrated in FIG. 14C, the first quantum dot 16 further includes a third shell 38 in addition to a quantum dot 20 and a second shell 26. Note that a plurality of the first quantum dots 16 may be connected to each other by a crystal structure of the third shell 38 to form an integral quantum dot structure.

The third shell 38 is formed around the second shell 26. The third shell 38 may include the same material as the second shell 26, and may include an inorganic shell material used for the quantum dots of a known core/shell structure.

The light-emitting device 1 according to the present embodiment is manufactured by the same method except for step S5, that is, the step of forming the light-emitting layer among the steps illustrated in FIG. 2. The step of forming the light-emitting layer of the light-emitting device 1 according to the present embodiment will be described in more detail with reference to FIGS. 15 to 19.

Figure 15:
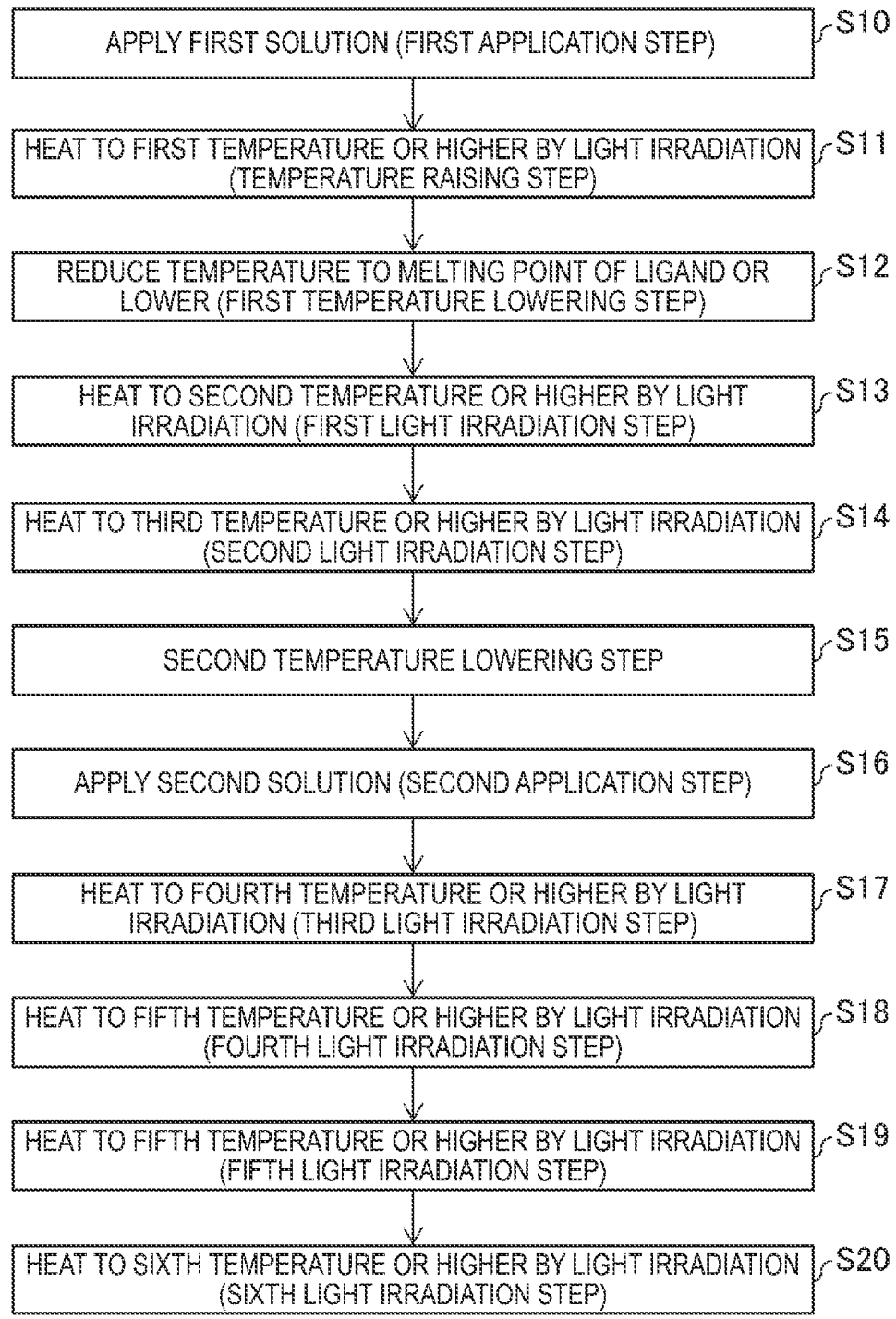
FIG. 15 is a flowchart for describing a method for manufacturing the light-emitting device according to the fourth embodiment.
Figure 16:
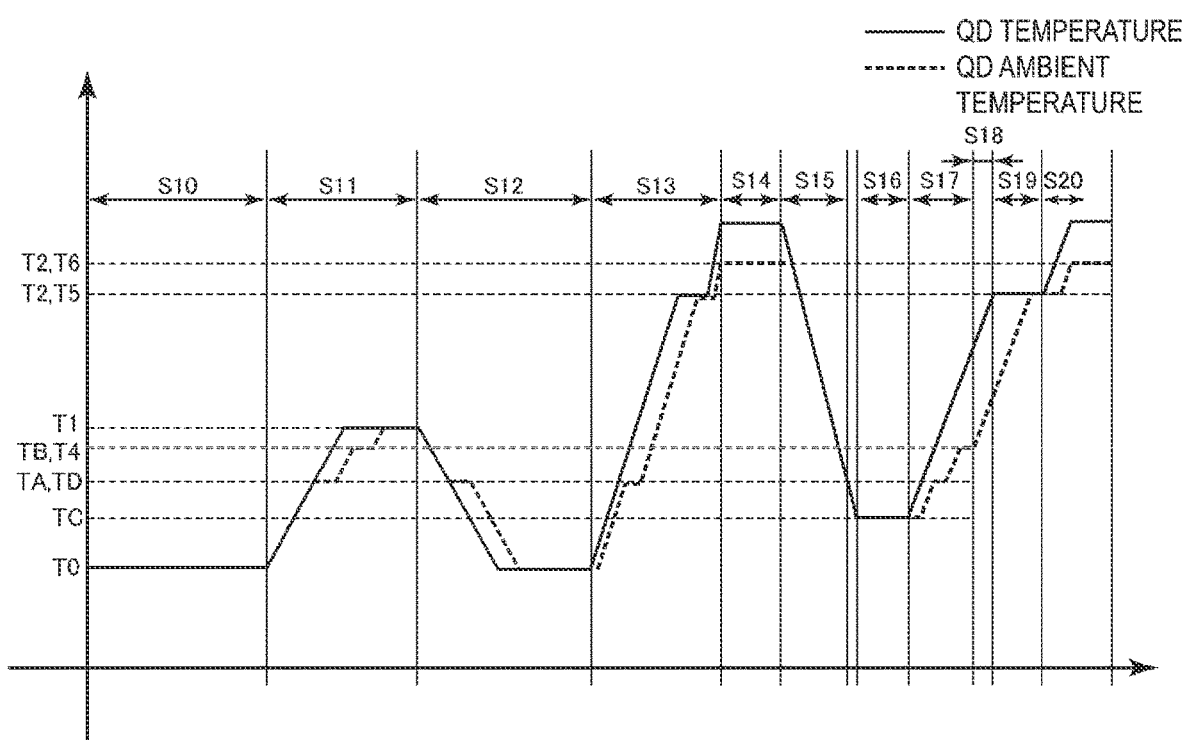
FIG. 16 is a graph for describing a relationship between an elapsed time and a temperature in a step of forming the light-emitting layer according to the fourth embodiment.
Figure 17:
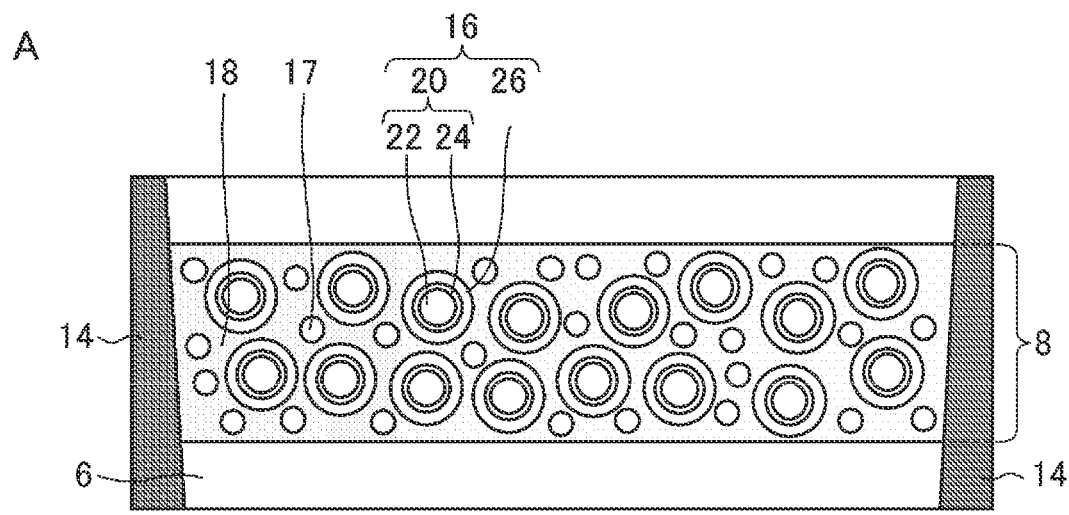
FIGS. 17A and 17B are forming-step cross-sectional views for describing the step of forming the light-emitting layer according to the fourth embodiment.
Figure 17:
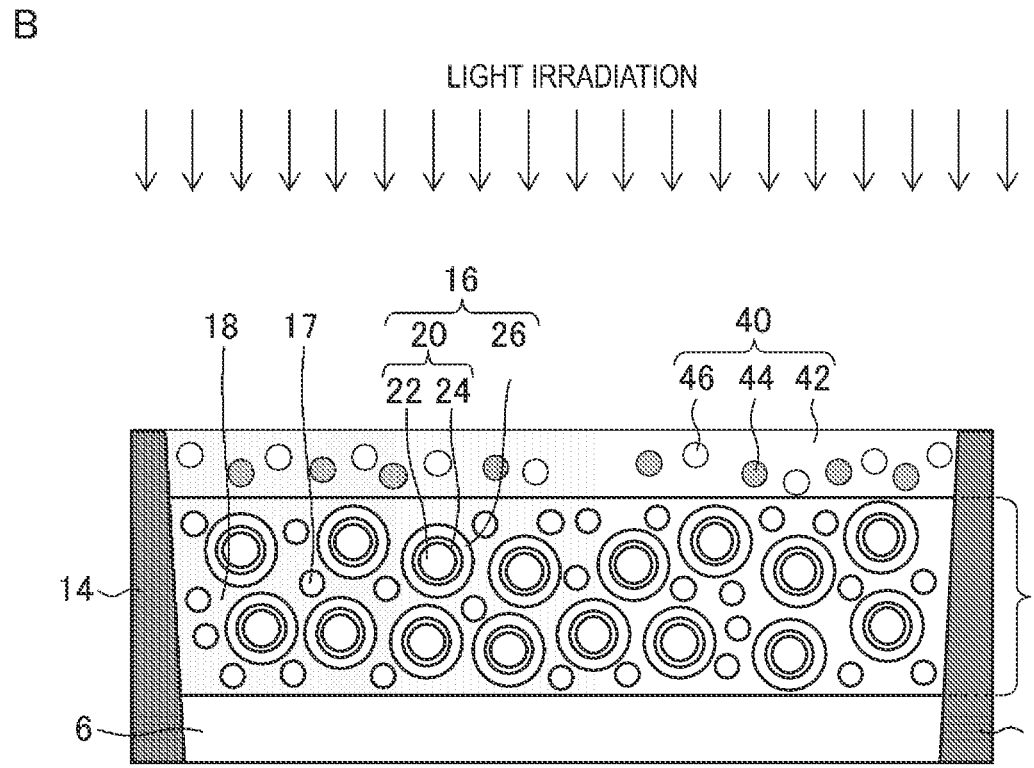
Figure 18:
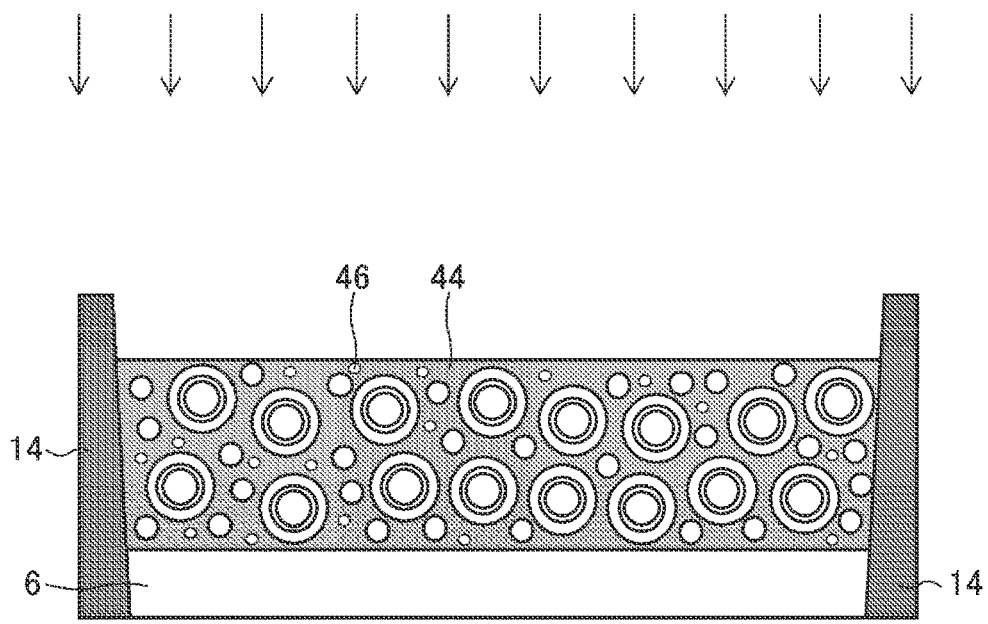
FIGS. 18A and 18B are forming-step cross-sectional views for describing the step of forming the light-emitting layer according to the fourth embodiment.
Figure 18:
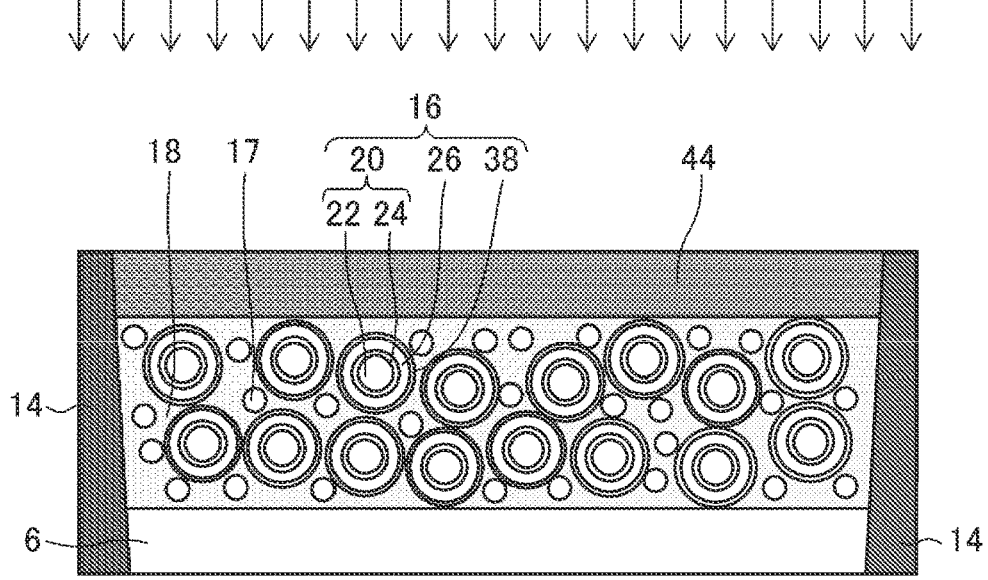
Figure 19:
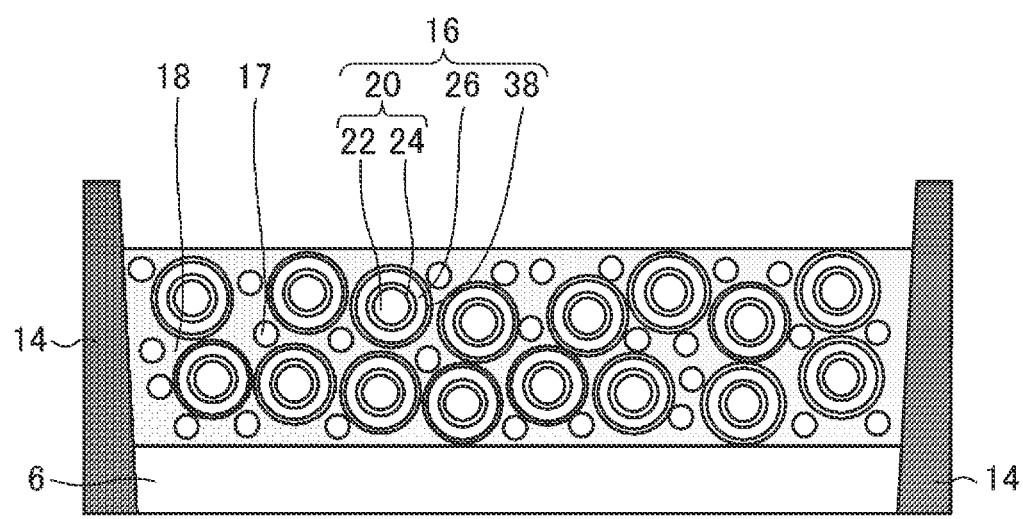
FIG. 19 is another forming-step cross-sectional view for describing the step of forming the light-emitting layer according to the fourth embodiment.

FIG. 15 is a flowchart for describing the step of forming the light-emitting layer corresponding to a step of forming a quantum dot layer in the present embodiment. FIG. 16 is a graph for describing a relationship between an elapsed time and a temperature in the step of forming the light-emitting layer. Similar to FIG. 4, a solid line in FIG. 16 depicts a temperature of the quantum dots 20 on an array substrate 3, and a broken line depicts a temperature around the quantum dots 20. FIGS. 17 to 19 are forming-step cross-sectional views for describing the step of forming the light-emitting layer.

In the step of forming the light-emitting layer according to the present embodiment, the same method as that described in the previous embodiment is performed from step S10 to step S14. In the present embodiment, subsequent to step S14, the light irradiation is stopped and a step of second temperature lowering is performed in which the temperature of the quantum dots 20 is lowered to a temperature equal to or lower than the third temperature T3 (step S15).

In the present embodiment, by the step of the second temperature lowering, the cooling is performed until the temperature of the quantum dots 20 becomes a temperature TC, which is lower than a temperature TA. The temperature TC may be higher than a temperature T0 or may be equal to the temperature T0. When the temperature of the quantum dots 20 drops, the temperature around the quantum dots 20 also drops. At the point in time of the completion of the step of the second temperature lowering, the first quantum dot 16 and a second quantum dot 17 are formed in an upper layer relative to a first charge transport layer 6, as illustrated in FIG. 17A.

After the temperature of the quantum dots 20 has reached the temperature TB by the step of the second temperature lowering, a step of second application is performed in which a second solution 40 is applied on a position overlapping with the array substrate 3 as illustrated in FIG. 17B (step S16).

The second solution 40 contains a second solvent 42, an organic material 44, and a second inorganic precursor 46. The second solvent 42 may be the same as the first solvent 32, and may be hexane. The organic material 44 may be an organic material used for a ligand of known quantum dots in the related art, or may be the same material as that of the ligand 18. The second inorganic precursor 46 contains the same material as the third shell 38 described above. When the material of the third shell 38 is the same as the material of the second shell 26, the second inorganic precursor 46 is the same as the first inorganic precursor 30.

Subsequently, a step of third light irradiation is performed (step S17), in which third light irradiation is performed to irradiate the second solvent 42 above the array substrate 3 with ultraviolet light so as to heat the quantum dots 20 again. In the step of the third light irradiation, the quantum dots 20 are heated until the quantum dots 20 have a fourth temperature T4 or higher as indicated in FIG. 16.

The fourth temperature T4 is the higher temperature of a melting point of the organic material 44 and a boiling point of the second solvent 42. A temperature TD indicated in FIG. 16 is the lower temperature of the melting point of the organic material 44 and the boiling point of the second solvent 42. The fourth temperature T4 and the temperature TD are higher than the temperature T0. The fourth temperature T4 may be equal to the first temperature T1, and the temperature TD may be equal to the temperature TA.

The ambient temperature of the quantum dots 20 follows a rise of the temperature of the quantum dots 20 with a slight delay, as depicted in FIG. 16, until the temperature of the quantum dots 20 rises from the temperature T0 to the temperature TD. However, when the ambient temperature of the quantum dots 20 rises up to the temperature TD and one of the melting of the organic material 44 and the evaporation of the second solvent 42 begins, the ambient temperature of the quantum dots 20 maintains the temperature TD for a while.

By further carrying on the third light irradiation, one of the melting of the organic material 44 and the evaporation of the second solvent 42 ends, and the ambient temperature of the quantum dots 20 begins to rise again. Then, when the ambient temperature of the quantum dots 20 rises up to the fourth temperature T4 and the other one of the melting of the organic material 44 and the evaporation of the second solvent 42 begins, the ambient temperature of the quantum dots 20 maintains the fourth temperature T4 for a while.

Thus, by the step of the third light irradiation, the melting of the organic material 44 and the evaporation of the second solvent 42 are completed. After the completion of the step of the third light irradiation, as illustrated in FIG. 18A, the second solvent 42 has vaporized from above the array substrate 3, and the second inorganic precursor 46 is dispersed in the periphery of the first quantum dots 16 in the melted organic material 44. Note that a scale of the second inorganic precursor 46 is changed only in FIG. 18A for illustration, but an actual shape of the second inorganic precursor 46 may be invariant before and after the step of the temperature raising.

Subsequently, a step of fourth light irradiation is performed in which fourth light irradiation is performed on the position where the second solvent 42 has been applied on the array substrate 3 so as to heat the quantum dots 20 (step S18). In the step of the fourth light irradiation, the fourth light irradiation is continued until the temperature of the quantum dots 20 reaches a fifth temperature T5 indicated in FIG. 4. In the fourth light irradiation, ultraviolet light may be emitted as in the third light irradiation, or ultraviolet light having a greater amount of energy per unit time than the ultraviolet light emitted in the third light irradiation may be emitted. The third light irradiation and the fourth light irradiation may be performed continuously.

Subsequently, from the point in time when the temperature of the quantum dots 20 reaches the fifth temperature T5, a step of fifth light irradiation is performed in which fifth light irradiation is performed to maintain the temperature of the quantum dots 20 at approximately the fifth temperature T5 (step S19). In the fifth light irradiation, ultraviolet light may be emitted as in the third light irradiation and the fourth light irradiation, or ultraviolet light having a less amount of energy per unit time than the ultraviolet light emitted in the fourth light irradiation may be emitted. Since the temperature of the quantum dots 20 is maintained at the fifth temperature T5 in the step of the fifth light irradiation, the ambient temperature of the quantum dots 20 after having reached the fifth temperature T5 is also maintained at the fifth temperature T5.

The fifth temperature T5 is higher than the fourth temperature T4, and is a temperature at which the second inorganic precursor 46 epitaxially grows around the second shell 26 by thermochemical reaction. Thus, while the ambient temperature of the quantum dots 20 is maintained at the fifth temperature T5, the second inorganic precursor 46 gradually grows epitaxially around the second shell 26. With this, the third shell 38 is formed around the second shell 26 of each of the first quantum dot 16, as illustrated in FIG. 18B.

As described above, as illustrated in FIG. 18B, the first quantum dot 16 including the quantum dot 20, the second shell 26, and the third shell 38 is formed. Note that, in the step of the fifth light irradiation, by forming the third shell 38, the melted organic material 44 is pushed up to an upper layer, whereby the organic material 44 remains in the upper layer.

Subsequently, a step of sixth light irradiation is performed in which sixth light irradiation is additionally performed to heat the quantum dots 20 so that the temperature of the quantum dots 20 becomes a sixth temperature T6 or higher (step S20). In the sixth light irradiation, ultraviolet light may be emitted as in the third light irradiation, the fourth light irradiation, and the fifth light irradiation, or light having a greater amount of energy per unit time than the light emitted in the fifth light irradiation may be emitted. The sixth temperature T6 is higher than the fifth temperature T5, and is equivalent to the boiling point of the organic material 44.

When the ambient temperature of the quantum dots 20 reaches the sixth temperature T6 by the heating of the quantum dots 20 in the step of the sixth light irradiation, evaporation of the organic material 44 begins and the ambient temperature of the quantum dots 20 maintains the sixth temperature T6 for a while. With this, in the step of the sixth light irradiation, the organic material 44 vaporizes, and as illustrated in FIG. 19, the organic material 44 is removed. As described above, the step of forming the light-emitting layer in the present embodiment is completed.

In the light-emitting device 1 according to the present embodiment, the third shell 38 is formed around the second shell 26. The light-emitting layer 8 may include a third quantum dot formed of the same material as the third shell.

Thus, the first quantum dots 16 according the present embodiment have a higher proportion of the volume to the entire volume of the light-emitting layer 8 compared to the first quantum dots 16 in the previous embodiments. That is, the light-emitting layer 8 in the present embodiment has an improvement in filling rate of the shell formed around a core 22 of the quantum dot 20 in the light-emitting layer 8. In other words, after the step of the fifth light irradiation is performed, the density of inorganic matters with respect to the entire volume of the light-emitting layer 8 is higher than that before the step of the fifth light irradiation is performed. Therefore, with the configuration described above, the light-emitting device 1 according to the present embodiment can further improve the reliability of the light-emitting layer 8.

In the present embodiment, after the step of the first light irradiation is performed, the step of the second light irradiation may be omitted, and then the step of the second temperature lowering and the subsequent steps may be performed sequentially. That is, the vaporization of the ligand 18 and the vaporization of the organic material 44 may be carried out collectively in the step of the sixth light irradiation. This decreases the number of steps of the light irradiation, which leads to a reduction in tact time and a reduction in manufacturing cost.

In the present embodiment, although not limited thereto, the step of forming the light-emitting layer is described in the case where the fourth temperature T4 is equal to the first temperature T1, the fifth temperature T5 is equal to the second temperature T2, and the sixth temperature T6 is equal to the third temperature T3. Such a configuration may be realized simply and easily by making the first solvent 32 and the second solvent 42 be the same, the material of the ligand 18 and the organic material 44 be the same, and the first inorganic precursor 30 and the second inorganic precursor 46 be the same.

With this, the temperature as the heating reference for each light irradiation may be adjusted between the steps from the temperature raising to the second light irradiation and the steps from the third light irradiation to the sixth light irradiation. Accordingly, the configuration described above leads to a simplification of the entire step of forming the light-emitting layer.

In each of the embodiments described above, a case has been described in which the quantum dot layer including the quantum dots 20 is the light-emitting layer 8. However, no such limitation is intended, and the first charge transport layer 6 or the second charge transport layer 10 may be the quantum dot layer including the quantum dots 20, for example. In this manner, in the case where each charge transport layer includes the quantum dots 20, these quantum dots 20 may be provided with a function to transport carriers. In this case, in comparison with a charge transport layer including known quantum dots, the stability of the quantum dots 20 in each charge transport layer is improved, so that the efficiency of carrier transport in each of the charge transport layers is improved, leading to an improvement in the luminous efficiency of the light-emitting device 1. Each of the charge transport layers including the quantum dots 20 described above may also be formed by the same technique as the step of forming the quantum dot layer in each of the embodiments.

In each of the above-described embodiments, a display device including a plurality of light-emitting elements and having a display face DS is exemplified to describe the configuration of the light-emitting device 1. However, no such limitation is intended, and the light-emitting device 1 in each of the embodiments described above may be a light-emitting device including a single light-emitting element.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A method for manufacturing a light-emitting device that includes, on a substrate, a light-emitting element including a first electrode, a second electrode, and a quantum dot layer between the first electrode and the second electrode, the method comprising:
forming the quantum dot layer,
wherein forming the quantum dot layer includes:
applying, on a position overlapping with the substrate, a first solution including a plurality of quantum dots, a ligand, a first inorganic precursor, and a first solvent, each of the plurality of quantum dots including a core and a first shell coating the core, the ligand coordinating with each of the plurality of quantum dots,
raising a temperature until the ligand melts and the first solvent vaporizes after applying the first solution,
lowering the temperature to a melting point of the ligand or lower after raising the temperature, and
performing first light irradiation of epitaxially growing the first inorganic precursor around the first shell by the first light irradiation, after lowering the temperature, to form a second shell coating the first shell,
wherein the ligand is present around the second shell after performing the first light irradiation, and
wherein forming the quantum dot layer further includes performing second light irradiation, after performing the first light irradiation, to vaporize the ligand.

2. The method according to claim 1,
wherein the plurality of quantum dots absorbs emitted light and generates heat in performing the first light irradiation.

3. The method according to claim 1,
wherein a boiling point of the first solvent is equal to or higher than the melting point of the ligand, and
in performing the first light irradiation, the first solvent vaporizes after the ligand melts.

4. The method according to claim 1, further comprising:
forming the first electrode prior to forming the quantum dot layer,
wherein the first electrode includes a metal thin film having light reflectivity on a surface.

5. The method according to claim 1,
wherein the light-emitting element includes a plurality of light-emitting elements, and
in forming the quantum dot layer, the quantum dot layer is formed for each of the plurality of light-emitting elements, and, in a part of the plurality of light-emitting elements, a quantum dot layer of a kind different from another part of the plurality of light-emitting elements is formed.

6. The method according to claim 5,
wherein the plurality of light-emitting elements includes a first light-emitting element configured to emit red light, a second light-emitting element configured to emit green light, and a third light-emitting element configured to emit blue light.

7. The method according to claim 1,
wherein performing the first light irradiation includes performing a partial exposure by a laser irradiation.

8. The method according to claim 1,
wherein performing the first light irradiation includes performing a partial exposure using a photomask.

9. The method according to claim 1,
wherein light having an amount of energy per unit time greater than an amount of energy per unit time of light emitted in the first light irradiation is emitted in the second light irradiation.

10. The method according to claim 1,
wherein the plurality of quantum dots absorbs emitted light and generates heat in performing the second light irradiation.

11. A method for manufacturing a light-emitting device that includes, on a substrate, a light-emitting element including a first electrode, a second electrode, and a quantum dot layer between the first electrode and the second electrode, the method comprising:
forming the quantum dot layer,
wherein forming the quantum dot layer includes:
applying, on a position overlapping with the substrate, a first solution including a plurality of quantum dots, a ligand, a first inorganic precursor, and a first solvent, each of the plurality of quantum dots including a core and a first shell coating the core, the ligand coordinating with each of the plurality of quantum dots,
raising a temperature until the ligand melts and the first solvent vaporizes after applying the first solution,
lowering the temperature to a melting point of the ligand or lower after raising the temperature, and
performing first light irradiation of epitaxially growing the first inorganic precursor around the first shell by the first light irradiation, after lowering the temperature, to form a second shell coating the first shell,
wherein the ligand is present around the second shell after performing the first light irradiation,
wherein performing the first light irradiation includes performing a partial exposure by a laser irradiation, and
the method further comprises:
removing, after performing the first light irradiation, the first solution at a position overlapping with a position different from a position where the first light irradiation is performed; and performing second light irradiation, after applying the first solution, raising the temperature, performing the first light irradiation, and removing the first solution are repeatedly performed in this order according to a luminescent color of a corresponding light-emitting element, to vaporize the ligand.

12. The method according to claim 11,
wherein the plurality of quantum dots absorbs emitted light and generates heat in performing the first light irradiation.

13. The method according to claim 11,
wherein a boiling point of the first solvent is equal to or higher than the melting point of the ligand, and
in performing the first light irradiation, the first solvent vaporizes after the ligand melts.

14. The method according to claim 11, further comprising:
forming the first electrode prior to forming the quantum dot layer,
wherein the first electrode includes a metal thin film having light reflectivity on a surface.

15. The method according to claim 11,
wherein the light-emitting element includes a plurality of light-emitting elements, and
in forming the quantum dot layer, the quantum dot layer is formed for each of the plurality of light-emitting elements, and, in a part of the plurality of light-emitting elements, a quantum dot layer of a kind different from another part of the plurality of light-emitting elements is formed.

16. The method according to claim 15,
wherein the plurality of light-emitting elements includes a first light-emitting element configured to emit red light, a second light-emitting element configured to emit green light, and a third light-emitting element configured to emit blue light.

17. The method for manufacturing a light-emitting device according to claim 11,
wherein a position where the laser irradiation is performed, in performing the partial exposure, is a position overlapping with the first electrode.

18. The method according to claim 11,
wherein, in performing the second light irradiation, a position overlapping with a position where the first solution is applied is irradiated with light having an amount of energy per unit time greater than an amount of energy per unit time of light emitted in performing the first light irradiation.

* * * * *